United States Patent
van de Ven et al.

(10) Patent No.: US 9,515,056 B2
(45) Date of Patent: Dec. 6, 2016

(54) SOLID STATE LIGHTING DEVICE INCLUDING NARROW SPECTRUM EMITTER

(71) Applicant: Cree, Inc., Durham, NC (US)

(72) Inventors: Antony Paul van de Ven, Hong Kong (CN); Benjamin A. Jacobson, Chicago, IL (US); Bernd P. Keller, Santa Barbara, CA (US)

(73) Assignee: Cree, Inc., Durham, NC (US)

( * ) Notice: Subject to any disclaimer, the term of this patent is extended or adjusted under 35 U.S.C. 154(b) by 0 days.

(21) Appl. No.: 14/298,327

(22) Filed: Jun. 6, 2014

(65) Prior Publication Data
US 2015/0357372 A1    Dec. 10, 2015

(51) Int. Cl.
| H01L 25/075 | (2006.01) |
| F21S 6/00 | (2006.01) |
| F21Y 101/02 | (2006.01) |
| F21Y 113/00 | (2016.01) |

(52) U.S. Cl.
CPC ............ H01L 25/0753 (2013.01); *F21S 6/003* (2013.01); *F21Y 2101/02* (2013.01); *F21Y 2113/007* (2013.01); *H01L 2924/0002* (2013.01)

(58) Field of Classification Search
CPC ........ H01L 27/156; H01L 33/58; H01L 33/60; H01L 33/62; H01L 27/322; H01L 33/50; H01L 33/502; H01L 33/501; H01L 33/504
USPC ...................... 313/498–512; 362/2, 510, 293
See application file for complete search history.

(56) References Cited

U.S. PATENT DOCUMENTS

| 6,234,648 B1* | 5/2001 | Borner et al. ................ 362/235 |
| 6,577,073 B2 | 6/2003 | Shimizu et al. |
| 6,600,175 B1 | 7/2003 | Baretz et al. |
| 7,005,679 B2 | 2/2006 | Tarsa et al. |
| 7,026,756 B2 | 4/2006 | Shimizu et al. |
| 7,497,973 B2 | 3/2009 | Radkov et al. |
| 7,744,242 B2 | 6/2010 | Kramer |
| 8,201,966 B2* | 6/2012 | Hall et al. ..................... 362/231 |

(Continued)

FOREIGN PATENT DOCUMENTS

| JP | 2003316714 A | 11/2003 |
| JP | 2009152213 A | 7/2009 |

OTHER PUBLICATIONS

U.S. Appl. No. 14/259,993, filed Apr. 23, 2014.
(Continued)

*Primary Examiner* — Anne Hines
*Assistant Examiner* — Jose M Diaz
(74) *Attorney, Agent, or Firm* — Withrow & Terranova, P.L.L.C.; Vincent K. Gustafson

(57) ABSTRACT

A multi-emitter solid state lighting device includes at least one narrow spectral output solid state light emitter, such as may be in the green range, having a full width-half maximum emission value of no greater than 30 nm. First, second, and third electrically solid state emitters may include dominant wavelengths in the ranges of 485-505 nm (or 491-505 nm), 526-545 nm, and 615-625 nm. Aggregate emissions of a solid state lighting device may comprise a scotopic/photopic (S/P) ratio value that exceeds threshold values for conventional white light-emitting devices including at least one phosphor-converted LED by at least 10%, 20%, 30%, or 40%, in combination with reasonably high gamut and brightness, over a range of desired CCT values.

31 Claims, 12 Drawing Sheets

(56) References Cited

U.S. PATENT DOCUMENTS

| | | | |
|---|---|---|---|
| 8,523,385 B2* | 9/2013 | Lu et al. | 362/231 |
| 8,896,197 B2* | 11/2014 | Negley et al. | 313/501 |
| 2004/0090787 A1* | 5/2004 | Dowling et al. | 362/464 |
| 2004/0218387 A1 | 11/2004 | Gerlach | |
| 2007/0223219 A1 | 9/2007 | Medendorp et al. | |
| 2008/0179602 A1* | 7/2008 | Negley et al. | 257/88 |
| 2008/0179611 A1 | 7/2008 | Chitnis et al. | |
| 2009/0080185 A1 | 3/2009 | McMillan | |
| 2009/0184616 A1 | 7/2009 | Van De Ven et al. | |
| 2009/0207583 A1 | 8/2009 | Takano | |
| 2009/0306355 A1 | 12/2009 | Chavez et al. | |
| 2010/0140634 A1* | 6/2010 | van de Ven | H01L 25/0753 257/88 |
| 2010/0220471 A1 | 9/2010 | Rooymans | |
| 2010/0277907 A1 | 11/2010 | Phipps et al. | |
| 2011/0220920 A1* | 9/2011 | Collins et al. | 257/88 |
| 2012/0043907 A1* | 2/2012 | Lu et al. | 315/287 |
| 2012/0048327 A1* | 3/2012 | Gore | 136/244 |
| 2012/0286304 A1* | 11/2012 | LeToquin | H01L 25/0753 257/89 |
| 2012/0306355 A1 | 12/2012 | Seibel, II | |
| 2013/0020929 A1* | 1/2013 | van de Ven et al. | 313/498 |
| 2013/0038202 A1* | 2/2013 | Donners | 313/485 |
| 2013/0271991 A1 | 10/2013 | Hussell et al. | |
| 2013/0329021 A1* | 12/2013 | Fidler | G02B 26/04 348/54 |
| 2014/0055982 A1* | 2/2014 | Tao | F21V 9/16 362/84 |
| 2014/0217433 A1* | 8/2014 | Tudorica et al. | 257/89 |
| 2014/0301062 A1 | 10/2014 | David et al. | |
| 2015/0042241 A1* | 2/2015 | Su | H05B 33/0857 315/294 |

OTHER PUBLICATIONS

Author Unknown, "Chapter 4: Lighting Design Considerations," Advanced Lighting Guidelines, 2001 Edition, New Buildings Institute, 42 pages.

Author Unknown, "The Language of Light," Konica Minolta Sensing Europe B.V., accessed May 21, 2014 from https://www.konicaminolta.eu/fileadmin/content/eu/Measuring_Instruments/4_Learning_Centre/L_D/The_language_of_Light/language_of_light.pdf, 32 pages.

Author Unknown, "Outdoor Lighting: Visual Efficacy," ASSIST recommends, vol. 6, Issue 2, Jan. 2009, Alliance for Solid-State Illumination Systems and Technologies (ASSIST), 14 pages.

Ashdown, I., "Mesopic Photometry and Statistics," All Things Lighting, Apr. 21, 2014, http://agi32.com/blog/category/mesopoclighting/, 9 pages.

Halonen, L. et al. (Eds.), "Chapter 5: Lighting technologies," Annex 45 Guidebook on Energy Efficient Electric Lighting for Buildings, 2010, Aalto University School of Science and Technology, http://www.lightinglab.fi/IEAAnnex45/guidebook/5_lighting%20technologies.pdf, 46 pages.

Narendran, N. et al., "Color Rendering Properties of LED Light Sources," Solid State Lighting II: Proceedings of SPIE, vol. 4776, Nov. 26, 2002, SPIE, 8 pages.

Narendran, N., "Testing LED Lighting Fixtures and Comparing Them to Traditional Lighting Fixtures," euroLED 2008 Workshop, Jun. 5, 2008, Rensselaer Polytechnic Institute, 68 pages.

Nizamoglu, S., "Novel Nanocrystal-Integrated LEDs Utilizing Radiative and Nonradiative Energy Transfer for High-Quality Efficient Light Generation," Doctoral Thesis submitted to the Department of Electrical and Electronics Engineering and the Insitute of Engineering and Sciences, Bilkent University, Mar. 2011, 243 pages.

Van De Ven, A. et al., "Warm White illumination with high CRI and high efficacy by combining 455nm excited yellowish phosphor LEDs and red AlInGaP LEDs," First International Conference on White LEDs and Solid State Lighting, Nov. 28, 2007, LED Lighting Fixtures, Inc., 8 pages.

Van Der Steen, M., "Advantages with a high S/P ratio," OliNo, Oct. 28, 2013, accessed May 21, 2014 from http://www.olini.org/us/articles/2013/10/28/advantages-with-a-high-sp-ratio, 4 pages.

Kalloniatis, M., and Luu, C., "Color Perception", 2011 [retrieved on Oct. 2, 2015]. Retrieved from the Internet: <URL: http://webvision.med.utah.edu/book/part-viii-gabac-receptors/color-perception/>.

Willsey, A., and DeSalle, D., "Challenges of Meeting Aviation Color Requirements with LED Light Sources," Kopp Glass, Inc. Oct. 2011 [retrieved on Sep. 21, 2015]. Retrieved from the Internet: <URL: http://go.koppglass.com/meeting-aviation-color-requirements-led-light-sources>.

Eskow, C., "Light Matters: Designing illumination systems with high-brightness LEDs," Jan. 12, 2012 [retrieved on Oct. 2, 2015 AVNET electronics marketing, Jul. 2009 [retrieved on Sep. 29, 2015]. Retrieved from the Internet: <URL: http://www.em.avnet.com/en-us/design/marketsolutions/Documents/Lighting/LightSpeed-Eskow-0709.pdf>.

Author Unknown, "LEDnovation EnhanceLite A19 LED Light Bulb Review," LED Light Review, 2012, LED-Light-Review.com, pp. 1-5.

Deshpande, Anirudha, "New Phosphors and Blends for Blue and Violet based Remote Phosphor LED packages," GE Lumination, Phosphor Global Summit, Mar. 24, 2010, San Diego, California, General Electric, 18 pages.

Nichia Corporation, "Specifications for Warm White LED: NTCLS024B-M3," Nichia STS-DA1-3333A, Cat No. 150223, Date Unknown, Nichia Corporation, 17 pages.

Non-Final Office Action for U.S. Appl. No. 14/702,564, mailed Feb. 17, 2016, 16 pages.

* cited by examiner

| CCT | S/P Ratio Range |
|---|---|
| 2700K | 1.1 – 1.4 |
| 3000K | 1.2 – 1.5 |
| 3500K | 1.3 – 1.6 |
| 4000K | 1.4 – 1.8 |
| 5000K | 1.6 – 2.0 |
| 6000K | 1.9 – 2.2 |

| CCT | Conventional Phosphor-Converted Solid State Source (R + BSY + B) Along BBL (approximate values) | | "Narrow Green" Modeling Results | | Comparison (Modeling Results / Conventional) | |
|---|---|---|---|---|---|---|
| | $S/P_1$ | $GAI_1$ (%) | $S/P_2$ | $GAI_2$ (%) | $S/P_2 \div S/P_1$ | $GAI_2 \div GAI_1$ |
| 2700 | 1.2 | 55 | 2 | 49 | 1.67 | 0.89 |
| 3000 | 1.3 | 64 | 2.3 | 58 | 1.77 | 0.91 |
| 3500 | 1.4 | 73 | 2.6 | 67 | 1.86 | 0.92 |
| 4000 | 1.5 | 79 | 3 | 74 | 2.0 | 0.94 |
| 4500 | 1.65 | 83 | 3.4 | 80 | 2.06 | 0.96 |
| 5000 | 1.8 | 100 | 3.6 | 84 | 2.0 | 0.84 |

FIG. 5

| CCT | S/P Value, Empirical Low Range | S/P Value, Empirical High Range | S/P Value, Modeled Narrow Green | Comparison 1, Modeled Result / Empirical Low Range | Comparison 2, Modeled Result / Empirical High Range |
|---|---|---|---|---|---|
| 2700 | 1.1 | 1.4 | 2 | 1.82 | 1.43 |
| 3000 | 1.2 | 1.5 | 2.3 | 1.92 | 1.53 |
| 3500 | 1.3 | 1.6 | 2.6 | 2.0 | 1.63 |
| 4000 | 1.4 | 1.8 | 3 | 2.14 | 1.67 |
| 5000 | 1.9 | 2.2 | 3.6 | 1.89 | 1.64 |

FIG. 6

SOLID STATE LIGHTING DEVICE INCLUDING NARROW SPECTRUM EMITTER

TECHNICAL FIELD

Subject matter herein relates to solid state lighting devices, and relates to associated methods of making and using such lighting devices.

BACKGROUND

Solid state light sources may be used to provide colored (e.g., non-white) or white light (e.g., perceived as being white or near-white). A solid state lighting device may include, for example, at least one organic or inorganic light emitting diode ("LED") or a laser. White solid state emitters have been investigated as potential replacements for white incandescent or fluorescent lamps for increased efficiency and longevity. Longevity of solid state emitters is of particular benefit in environments where access is difficult and/or where change-out costs are extremely high. Despite potential efficiency gains, solid state light sources may present challenges in simultaneously achieving high efficacy, good color reproduction, and color stability with respect to variations in operating temperature.

The terms "white light" or "whiteness" do not clearly cover the full range of colors along the Planckian or blackbody locus (BBL) since it is apparent that a candle flame and other incandescent sources appear yellowish, i.e., not completely white. Accordingly, the color of illumination may be better defined in terms of correlated color temperature (CCT) and proximity to the BBL. The white area proximate to (i.e., within approximately eight MacAdam ellipses of) the BBL and having a correlated color temperature between 2,500 K and 10,000 K, is shown in FIG. 1 (based on the 1931 CIE diagram).

As a heated object becomes incandescent, it first glows reddish, then yellowish, then white, and finally bluish. Thus, apparent colors of incandescing materials are directly related to their actual temperature (in Kelvin (K)). Practical materials that incandesce are said to have CCT values that are directly related to color temperatures of blackbody sources. CCT is intended to characterize the apparent "tint" of the illumination (e.g., warm or cool) produced by an electric light source.

General illumination generally has a CCT between 2,000-10,000 K, with the majority of lighting devices for general illumination having CCT values in a range of from 2,700-6,500 K. Quality artificial lighting generally attempts to emulate the characteristics of natural light. Natural light sources include daylight with a relatively high color temperature (e.g., ~5,000 K) and incandescent lamps having a lower color temperature (e.g., ~2,800 K).

Color reproduction is commonly measured using Color Rendering Index (CRI) or average Color Rendering Index (CRI Ra). CRI and CRI Ra provide relative measures of the shift in surface color and brightness of an object when lit by a particular lamp, wherein CRI utilizes fourteen indices (reference colors), and CRI Ra is a modified average utilizing the first eight indices, all of which have low to moderate chromatic saturation. Daylight has a high CRI (CRI Ra of approximately 100), with incandescent bulbs also being relatively close (Ra greater than 95), and with fluorescent lighting being less accurate (typical Ra of 70-80) and suitable for general illumination in contexts where accurate color perception is less important. For some general interior illumination, a CRI Ra>80 is acceptable. Sources with CRI Ra>85, and more preferably, CRI Ra>90, provide greater color quality.

CRI Ra (or CRI) alone is not a satisfactory measure of the benefit of a light source, since it confers little ability to predict color discrimination (i.e., to perceive subtle difference in hue) or color preference. There appears to be a natural human attraction to brighter color. Daylight provides a spectrum of light that allows the human eye to perceive bright and vivid colors, which allows objects to be distinguished even with subtle color shade differences. Accordingly, it is generally recognized that daylight is the "best" light for emphasizing and distinguishing color. The ability of human vision to differentiate color is different under CCT conditions providing the same CRI Ra. Such differentiation is proportional to the gamut of the illuminating light.

Gamut area of a light source can be calculated as the area enclosed within a polygon defined by the chromaticities in CIE 1976 u'v' color space of the eight color chips used to calculate CRI Ra when illuminated by a test light source. Gamut area index (GAI) is a convenient way of characterizing in chromaticity space how saturated the illumination makes objects appear—with a larger GAI making object colors appear more saturated. GAI is a relative number whereby an imaginary equal-energy spectrum (wherein radiant power is equal at all wavelengths) is scored as 100. GAI for a test source is determined by comparing color space area of the light being tested to the color space area produced by the imaginary or theoretical equal-energy spectrum (EES) source. Unlike CRI Ra (or CRI), which has a maximum value of 100, GAI can exceed 100, meaning that some sources saturate colors more than an equal-energy source serves to saturate color.

It is found that typical blackbody-like light sources and typical daylight-like light sources have different gamut areas. Low CCT sources (e.g., incandescent emitters) have a gamut area index of approximately 50% (i.e., about half the gamut area of the EES source). Sources with higher CCT values have a larger GAI. For example, a very bluish light with a CCT of 10,000K may have a GAI of 140%.

Wavelengths of light outside the visible spectrum have limited utility for direct illumination because they cannot be seen by the human eye, although it is noted that short wavelength non-visible light can cause certain materials to fluoresce. Even within the visible spectrum, the human eye exhibits greater response to some wavelengths of light than to others. Response of the human eye to light also varies with respect to the level of intensity of light.

At the back of a human eye, the retina contains millions of light receptors that convert light into electrified signals that are sent to vision centers of the brain. The two major categories of photoreceptors are called cones and rods because of their geometric shapes. The central part of the retina, called the fovea, contains only cones. The rest of the retina is populated with both rods and cones, with the number of rods exceeding the number of cones by a ratio of about 10 to 1.

Photopic vision is the vision of the eye under well-lit conditions. In humans and many other animals, photopic vision is mediated by cone cells, and allows color perception and significantly higher visual acuity than available with scotopic vision. A human eye uses three types of cones with biological pigments having maximum absorption values at wavelengths of about 420 nm (blue), 534 nm (bluish-green), and 564 nm (yellowish green) to sense light in three bands of color. Such cones provide maximum efficacy of about 683 lm/W at a wavelength of 555 nm (green).

Scotopic vision is the vision of the eye under low light conditions. In a human eye, cone cells are non-functional in low light; as a result, scotopic vision is produced exclusively through rod cells, which are most sensitive to wavelengths of light around 498 nm (green-blue) and are insensitive to wavelengths longer than about 640 nm (red). For young eyes, scotopic vision may peak around 507 nm, with a sensitivity equivalent to about 1700 lm/W. Scotopic vision results in poor color discrimination. Scotopic vision occurs at luminance levels of $10^{-2}$ to $10^{-6}$ cd/m$^2$; photopic vision occurs at luminance levels of 1 to $10^6$ cd/m$^2$ (normal light); and mesoptic vision occurs in intermediate lighting conditions (luminance levels of $10^{-2}$ to 1 cd/m$^2$). Mesoptic vision is effectively a combination of scotopic and photopic vision, but yields inaccurate visual acuity and color discrimination.

FIG. 2 illustrates scotopic and photopic luminosity functions, with the leftmost curve embodying a scotopic luminosity function (as adopted by the Commission Internationale de l'Éclairage (CIE) in 1951), and with the rightmost curve embodying photopic luminosity functions (wherein the solid line represents the CIE 1931 standard, the dashed curve represents the Judd-Vos 1978 modified data, and the dotted curve represents the Sharpe, Stockman, Jagla & Jägle 2005 data). The CIE 1931 photopic luminosity function also forms the central color matching function in the CIE 1931 color space. As shown in FIG. 2, the scotopic curve exhibits significant response above 420 nm, a peak at 507 nm, and very little response above 600 nm, whereas the photopic curve exhibits very limited response below 450 nm, a peak at 555 nm, and significant response above 650 nm before declining to zero response around 700 nm. For everyday light levels, the photopic luminosity function best approximates the response of the human eye; however, for low light levels, the response of the human eye changes and the scotopic luminosity function applies. This difference in the scotopic and photopic luminous efficacy of the source results from the shift of eye sensitivity function from photopic to scotopic conditions (i.e., peaking at 555 nm under photopic lighting conditions, while peaking at 507 nm under scotopic lighting conditions), also known as the Purkinje shift.

Historically, lighting manufacturers have utilized light meters to determine lumen output of a lamp, with such light meters being calibrated by examining the eye's sensitivity to only cone-activated vision in the fovea (i.e., the central part of the retina), while ignoring the effect of rod-activated vision. As a result, traditional lighting practice accepted a single sensitivity function based on the assumption that the more light-sensitive rods only functioned at very dim light levels. More recent studies have demonstrated that rod photoreceptors are active not only in dim light but also at typical interior light levels as well.

Since rods are more sensitive than cones to bluish-white light sources characteristic of higher CCT values, light sources with higher S/P ratios may potentially provide equivalent levels of perceived brightness and visual acuity at lower output power levels. This explains why environments lit by warm white (3000K) and even cool white (4100K) lamps (e.g., fluorescent lights) appear less bright than the same environment lit by lamps of a higher CCT values, such as 5000K or above. Light with high S/P ratios (typically correlated with higher CCT values) yields relatively smaller pupils at a given photopic light level, so that object light rays are collected more at the central region of the eye, which may result in improved optical vision. Since an environment may be illuminated with lamps having higher S/P ratios at lower power levels but provide perceived brightness levels equivalent to those attainable with lamps having lower S/P ratios at higher power levels, use of lamps having higher S/P ratios may provide basis for saving energy.

It may be challenging to provide solid state lamps with elevated S/P ratios in combination with reasonably high gamut area index values, particularly in desirable CCT ranges (e.g., from 2700K to 5000K).

The art continues to seek improved lighting devices that address one or more limitations inherent to conventional devices.

SUMMARY

The present disclosure relates in various aspects to lighting devices comprising multiple electrically activated solid state light emitters including at least one solid state light emitter including a narrow spectral output with a full width-half maximum emission value of no greater than 30 nm. In certain embodiments, at least one solid state light emitter with a narrow spectral output may comprise a dominant wavelength in the green spectrum. In certain embodiments, the plurality of electrically activated solid state light emitters may include at least one first electrically activated solid state light emitter, at least one second electrically activated solid state light emitter, and at least one third electrically activated solid state light emitter. In certain embodiments, the at least one first electrically activated solid state light emitter comprises a dominant wavelength in a range of from 485 nm to 505 nm (or in a range of from 491 nm to 505 nm in certain embodiments), at least one second electrically activated solid state light emitter comprises a dominant wavelength in a range of from 526 nm to 545 nm, and at least one third electrically activated solid state light emitter comprises a dominant wavelength in a range of from 615 to 625 nm. Aggregate emissions of such a lighting device may include a relatively high gamut area index (GAI) value (e.g., in a range of from 80 to 100) at certain color temperatures, and may include a S/P ratio that is increased relative to conventional solid state lighting devices. In certain embodiments, aggregate emissions of the lighting device may be functionally related to CCT, and may comprise a S/P ratio value in at least one of the following ranges (a) to (d): (a) a value of at least 0.000042 times the correlated color temperature, plus 0.53; (b) a value of at least 0.000045 times the correlated color temperature, plus 0.57; (c) a value of at least 0.000048 times the correlated color temperature, plus 0.62; and (d) a value of at least 0.000069 times the correlated color temperature, plus 0.14.

In one aspect, a lighting device includes: a plurality of electrically activated solid state light emitters including: at least one first electrically activated solid state light emitter comprising a dominant wavelength in a range of from 485 nm to 505 nm (or in a range of from 491 nm to 505 nm in certain embodiments); at least one second electrically activated solid state light emitter comprising a dominant wavelength in a range of from 526 nm to 545 nm; and at least one third electrically activated solid state light emitter comprising a dominant wavelength in a range of from 615 nm to 625 nm; wherein the at least one second electrically activated solid state light emitter comprises a narrow spectral output with a full width-half maximum emission value of no greater than 30 nm.

In another aspect, a lighting device includes: a plurality of electrically activated solid state light emitters including: at least one first electrically activated solid state light emitter comprising a first dominant wavelength; at least one second electrically activated solid state light emitter comprising a second dominant wavelength; and at least one third electrically activated solid state light emitter comprising a third dominant wavelength; wherein at least one of the first, the second, and the third electrically activated solid state light emitters comprises a narrow spectral output with a full width-half maximum emission value of no greater than 30 nm; wherein aggregate emissions of the lighting device comprise a gamut area index (GAI) value in a range of from 80 to 100; and wherein aggregate emissions of the lighting device comprise a correlated color temperature, and comprise a scotopic/photopic ratio in at least one of the following ranges: a value of at least 0.000042 times the correlated color temperature, plus 0.53; a value of at least 0.000045 times the correlated color temperature, plus 0.57; a value of at least 0.000048 times the correlated color temperature, plus 0.62; and a value of at least 0.000069 times the correlated color temperature, plus 0.14.

In another aspect, the present disclosure relates to a method comprising illuminating an object, a space, or an environment, utilizing a solid state lighting device as described herein.

In another aspect, any of the foregoing aspects, and/or various separate aspects and features as described herein, may be combined for additional advantage. Any of the various features and elements as disclosed herein may be combined with one or more other disclosed features and elements unless indicated to the contrary herein.

Other aspects, features and embodiments of the present disclosure will be more fully apparent from the ensuing disclosure and appended claims.

BRIEF DESCRIPTION OF THE DRAWINGS

FIG. 5 is a table identifying (i) approximate S/P ratio and GAI values for a conventional white LED-based source (including a red LED, blue LED, blue LED arranged to stimulate yellow phosphor) to produce aggregate emissions along the blackbody locus; (ii) S/P ratio and GAI values for a modeled solid state lighting device including red/orange, cyan, and narrow spectral output green solid state ("narrow green" modeling results); (iii) comparisons between S/P ratio values and GAI values for the conventional white LED source and the narrow green source.

FIG. 6 is a table comparing (a) S/P ratios for the empirical low range and empirical high range results summarized in FIG. 4 to (b) S/P ratios for the modeled "narrow green" lighting device summarized in FIG. 5.

DETAILED DESCRIPTION

Figures 1, 2:
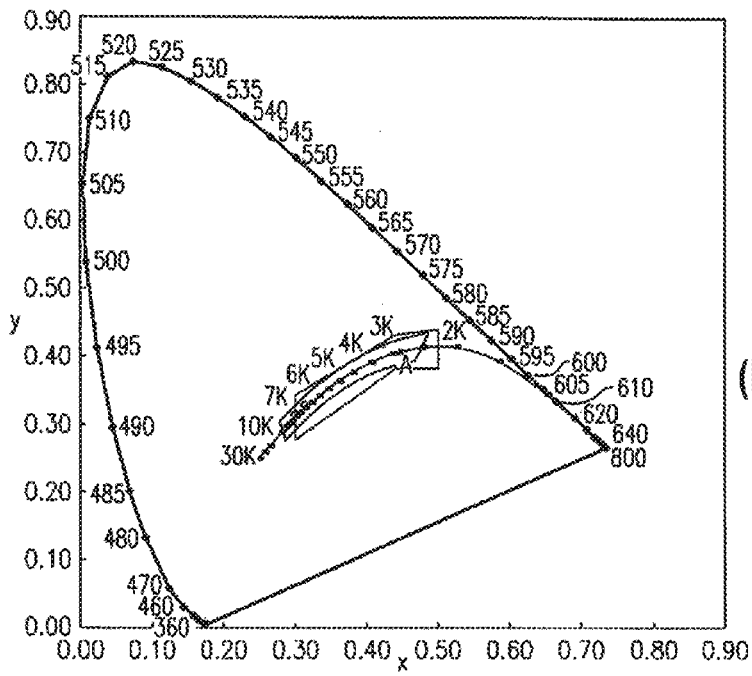
FIG. 1 is a 1931 CIE Chromaticity Diagram including representation of the blackbody locus, and further illustrating an approximately white area bounding the blackbody locus.
FIG. 2 illustrates scotopic and photopic luminosity functions, with the leftmost curve embodying a scotopic luminosity function (as adopted by the Commission Internationale de l'Éclairage (CIE) in 1951), and with the rightmost curve embodying photopic luminosity functions (wherein the solid line represents the CIE 1931 standard, the dashed curve represents the Judd-Vos 1978 modified data, and the dotted curve represents the Sharpe, Stockman, Jagla & Jägle 2005 data).

As noted previously, the art continues to seek solid state lighting devices providing desirable illumination characteristics. Subject matter disclosed herein relates to solid state lighting devices including one or more narrow spectrum emitters, such as may be useful to provide elevated S/P ratios and reasonably high gamut area index values in desirable CCT ranges.

Various embodiments disclosed herein relate to lighting devices comprising multiple electrically activated solid state light emitters (e.g., at least three in solid state light emitters in certain embodiments) including at least one solid state light emitter including a narrow spectral output with a full width-half maximum emission value of no greater than 30 nm (or no greater than 20 nm in certain embodiments). In certain embodiments, at least one solid state light emitter with a narrow spectral output may comprise a dominant wavelength in the green spectrum. In certain embodiments, multiple solid state light emitters having different dominant wavelengths may include a narrow spectral output with a full width-half maximum emission value of no greater than 30 nm (or no greater than 20 nm in certain embodiments). In certain embodiments, each solid state light emitter of a lighting device may include a narrow spectral output with a full width-half maximum emission value of no greater than 30 nm (or no greater than 20 nm in certain embodiments).

In certain embodiments, the plurality of electrically activated solid state light emitters may include at least one first electrically activated solid state light emitter, at least one second electrically activated solid state light emitter, and at least one third electrically activated solid state light emitter. In certain embodiments, the at least one first electrically activated solid state light emitter comprises a dominant wavelength in a range of from 485 nm to 505 nm (or in a range of from 491 nm to 505 nm), at least one second electrically activated solid state light emitter comprises a dominant wavelength in a range of from 526 nm to 545 nm, and at least one third electrically activated solid state light emitter comprises a dominant wavelength in a range of from 615 to 625 nm. In certain embodiments, each solid state light emitter comprises a dominant wavelength in the visible range.

In certain embodiments, a lighting device is devoid of any electrically activated solid state light emitter comprising a dominant wavelength in a range below 485 nm (or in a range below 491 nm in certain embodiments). In certain embodiments, a lighting device is devoid of any electrically activated solid state light emitter comprising a dominant wavelength in a range of from 546 nm to 614 nm. In certain embodiments, a lighting device is devoid of any electrically activated solid state light emitter comprising a dominant wavelength in a range of greater than 625 nm.

In certain embodiments, one or more electrically activated emitters may include solid state emitters such as (but not limited to) light emitting diodes. In certain embodiments, each solid state emitter and the lighting device may be devoid of lumiphoric material.

Aggregate emissions of such a lighting device may include a relatively high gamut area index (GAI) value (e.g., in a range of at least 70, in a range of at least 75, in a range of at least 80, in a range of from 80 to 100, or in another range disclosed herein) at certain CCT values, and may include a S/P ratio that is increased relative to conventional solid state lighting devices (e.g., enhanced by at least 10%, 15%, 20%, 25%, 30%, 35%, 40%, or another threshold value disclosed herein) with respect to emissions of at least certain CCT values. In certain embodiments, aggregate emissions of a lighting device may be functionally related to CCT, and may comprise a S/P ratio value in at least one of the following ranges (a) to (d): (a) a value of at least 0.000042 times the correlated color temperature, plus 0.53; (b) a value of at least 0.000045 times the correlated color temperature, plus 0.57; (c) a value of at least 0.000048 times the correlated color temperature, plus 0.62; and (d) a value of at least 0.000069 times the correlated color temperature, plus 0.14. In certain embodiments, aggregated emissions of lighting device comprise a correlated color temperature (CCT) value in a range of from 2700K to 5000K. In certain embodiments, aggregate emissions of the lighting device comprise a color rendering index (CRI Ra) value in a range not exceeding 50.

In certain embodiments, aggregate emissions of a lighting device including a relatively high GAI and an elevated S/P ratio may also include a relatively low CRI, such as in a range of less than 60, less than 55, less than 50, less than 45, less than 40, less than 35, less than 30, less than 25, or another threshold disclosed herein). At least certain values in the foregoing ranges may not be considered suitable for general (e.g., indoor) illumination, but may be useful for applications such as outdoor (e.g., roadway or street) lighting, automotive headlamps, automotive interior lamps, flashlights, and the like.

Unless otherwise defined, terms used herein should be construed to have the same meaning as commonly understood by one of ordinary skill in the art to which the present disclosure belongs. It will be further understood that terms used herein should be interpreted as having a meaning that is consistent with their meaning in the context of this specification and the relevant art, and should not be interpreted in an idealized or overly formal sense unless expressly so defined herein.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

Embodiments of the present disclosure are described herein with reference to cross-sectional, perspective, elevation, and/or plan view illustrations that are schematic illustrations of idealized embodiments of the present disclosure. Variations from the shapes of the illustrations as a result, for example, of manufacturing techniques and/or tolerances, are to be expected, such that embodiments of the present disclosure should not be construed as limited to particular shapes illustrated herein. The present disclosure may be embodied in different forms and should not be construed as limited to the specific embodiments set forth herein. In the drawings, the size and relative sizes of regions may be exaggerated for clarity. In certain drawings, conventional features inherent to LED devices known in the art but not essential to the understanding of the present disclosure have been omitted to facilitate ease of explanation of the inventive subject matter.

Unless the absence of one or more elements is specifically recited, the terms "comprising," "including," and "having" as used herein should be interpreted as open-ended terms that do not preclude the presence of one or more elements.

It will be understood that when an element such as a layer, region, or substrate is referred to as being "on" another element, it can be directly on the other element or intervening elements may be present. Moreover, relative terms such as "on", "above", "upper", "top", "lower", or "bottom" may be used herein to describe a relationship between one structure or portion to another structure or portion as illustrated in the figures, but it should be understood that such relative terms are intended to encompass different orientations of the device in addition to the orientation depicted in the figures. For example, if the device in the figures is turned over, structure or portion described as "above" other structures or portions would now be oriented "below" the other structures or portions.

The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials.

Solid state light emitting devices according to embodiments of the present disclosure may include, but are not limited to, III-V nitride based LED chips or laser chips fabricated on a silicon, silicon carbide, sapphire, or III-V nitride growth substrate, including (for example) devices manufactured and sold by Cree, Inc. of Durham, N.C. Such LEDs and/or lasers may optionally be configured to operate such that light emission occurs through the substrate in a so-called "flip chip" orientation. Such LED and/or laser chips may also be devoid of growth substrates (e.g., following growth substrate removal).

LED chips useable with lighting devices as disclosed herein may include horizontal devices (with both electrical contacts on a same side of the LED) and/or vertical devices (with electrical contacts on opposite sides of the LED). A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or printed circuit board (PCB), and have a second terminal wire bonded to the carrier substrate, electrical element, or PCB. Although certain embodiments shown in the figures may be appropriate for use with vertical LEDs, it is to be appreciated that the present disclosure is not so limited, such that any combination of one or more of the following LED configurations may be used in a single solid state light emitting device: horizontal LED chips, horizontal flip LED chips, vertical LED chips, vertical flip LED chips, and/or combinations thereof, with conventional or reverse polarity.

Solid state light emitters may be used individually or in groups to emit one or more beams. In certain embodiments, solid state light devices disclosed herein may be devoid of lumiphoric materials. In other embodiments, one or more solid state light emitters may be arranged to stimulate emissions of one or more lumiphoric materials (e.g., phosphors, scintillators, lumiphoric inks, quantum dots, day glow tapes, etc.) to generate light at one or more peak wavelength(s), or of at least one desired perceived color (including combinations of colors that may be perceived as white). Lumiphoric materials may be provided in the form of particles, films, or sheets. Inclusion of lumiphoric (also called 'luminescent') materials in lighting devices as described herein may be accomplished by any suitable means, including: direct coating on solid state emitters, dispersal in encapsulant materials arranged to cover solid state emitters; coating on lumiphor support elements (e.g., by powder coating, inkjet printing, or the like); incorporation into diffusers or lenses; and the like. Other materials, such as light scattering elements (e.g., particles) and/or index matching materials, may be associated with a lumiphoric material-containing element or surface.

Various substrates may be used as mounting elements on which, in which, or over which multiple solid state light emitters (e.g., emitter chips) may be arranged or supported (e.g., mounted). Exemplary substrates include printed circuit boards (including but not limited to metal core printed circuit boards, flexible circuit boards, dielectric laminates, and the like) having electrical traces arranged on one or multiple surfaces thereof. A substrate, mounting plate, or other support element may include a printed circuit board (PCB), a metal core printed circuit board (MCPCB), a flexible printed circuit board, a dielectric laminate (e.g., FR-4 boards as known in the art) or any suitable substrate for mounting LED chips and/or LED packages. In certain embodiments, at least a portion of a substrate may include a dielectric material to provide desired electrical isolation between electrical traces or components of multiple LEDs. In certain embodiments, a substrate can comprise ceramic such as alumina, aluminum nitride, silicon carbide, or a polymeric material such as polyimide, polyester, etc. In certain embodiments, a substrate can comprise a flexible circuit board or a circuit board with plastically deformable portions to allow the substrate to take a non-planar (e.g., bent) or curved shape allowing for directional light emission with LED chips of one or more LED components also being arranged in a non-planar manner.

In certain embodiments, one or more LED components can include one or more "chip-on-board" (COB) LED chips and/or packaged LED chips that can be electrically coupled or connected in series or parallel with one another and mounted on a portion of a substrate. In certain embodiments, COB LED chips can be mounted directly on portions of substrate without the need for additional packaging.

Certain embodiments may involve use of solid state emitter packages. A solid state emitter package may include at least one solid state emitter chip (more preferably multiple solid state emitter chips) that is enclosed with packaging elements to provide environmental protection, mechanical protection, color selection, and/or light focusing utility, as well as electrical leads, contacts, and/or traces enabling electrical connection to an external circuit. One or more emitter chips may be optionally arranged to stimulate one or more lumiphoric materials, which may be coated on, arranged over, or otherwise disposed in light receiving relationship to one or more solid state emitters. A lens and/or encapsulant material, optionally including lumiphoric material, may be disposed over solid state emitters, lumiphoric materials, and/or lumiphor-containing layers in a solid state emitter package.

In certain embodiments, a light emitting apparatus as disclosed herein (whether or not including one or more LED packages) may include at least one of the following items arranged to receive light from multiple LEDs: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters. In certain embodiments, a light emitting apparatus including multiple LEDs may include at least one of the following items arranged to receive light from multiple LEDs: multiple lenses; multiple optical elements; and multiple reflectors. Examples of optical elements include, but are not limited to elements arranged to affect light mixing, focusing, collimation, dispersion, and/or beam shaping.

In certain embodiments, a package including multiple solid state emitters may include multiple die attach pads, with a single die attach pad supporting each separately controllable solid state emitter or each separately controllable group of solid state emitters. A package including multiple solid state emitters may include a single lens (e.g., a molded lens) arranged to transmit at least a portion of light emanating from each solid state emitter. In certain embodiments, a molded lens may be arranged in direct contact with LED chips, die attach pads, other electrical elements, and/or exposed insulating material along a top surface of a substrate comprising insulating material. In certain embodiments, a lens may be textured or faceted to improve light extraction, and/or a lens may contain or have coated thereon various materials such as lumiphors and/or scattering particles.

In certain embodiments, a package may include a molded lens arranged to transmit light emitted by multiple LEDs. As known in the art, a mold including one or more cavities can be arranged over a substrate (or a panel of substrate material, from which multiple substrates may be singulated by sawing or other means) and LED chips arranged thereon, with the mold comprising a lens material and/or encapsulant in liquid form. In certain embodiments, a lens may be formed of liquid curable silicone, and LED chips may be embedded in liquid silicone, which is subsequently cured to form one or more lenses. Alternatively, a lens may be pre-molded and then affixed (e.g., with adhesives, thermal bonding, or any other suitable joining method) to a subassembly including a substrate to which, or over which, multiple LED chips are mounted.

The expressions "lighting device," "light emitting device," and "light emitting apparatus" as used herein are not limited, except that such elements are capable of emitting light. That is, a lighting device or light emitting apparatus can be a device which illuminates an area or volume, e.g., a structure, a swimming pool or spa, a room, a warehouse, an indicator, a road, a parking lot, a vehicle, signage, e.g., road signs, a billboard, a ship, a toy, a mirror, a vessel, an electronic device, a boat, an aircraft, a stadium, a computer, a remote audio device, a remote video device, a cell phone, a tree, a window, an LCD display, a cave, a tunnel, a yard, a lamppost, or a device or array of devices that illuminate an enclosure, or a device that is used for edge or back-lighting (e.g., backlight poster, signage, LCD displays), light bulbs, bulb replacements (e.g., for replacing AC incandescent lights, low voltage lights, fluorescent lights, etc.), outdoor lighting, street lighting, security lighting, exterior residential lighting (wall mounts, post/column mounts), ceiling fixtures/wall sconces, under cabinet lighting, lamps (floor and/or table and/or desk), landscape lighting, track lighting, task lighting, specialty lighting, ceiling fan lighting, archival/art display lighting, high vibration/impact lighting-work lights, etc., mirrors/vanity lighting, or any other light emitting devices. An illuminated area may include at least one of the foregoing items. In certain embodiments, lighting devices or light emitting apparatuses as disclosed herein may be self-ballasted. In certain embodiments, a light emitting apparatus may be embodied in a light fixture.

In preferred embodiments, a solid state lighting device is devoid of any incandescent light emitting element.

Methods include illuminating an object, a space, or an environment, utilizing one or more lighting devices or light emitting apparatuses as disclosed herein. In certain embodiments, a lighting apparatus as disclosed herein includes multiple LED components arranged in an array (e.g., a two-dimensional array).

Certain embodiments disclosed herein relate to lighting devices comprising multiple electrically activated solid state light emitters (e.g., at least three in solid state light emitters in certain embodiments) including at least one solid state light emitter including a narrow spectral output with a full width-half maximum emission value of no greater than 30 nm. In certain embodiments, at least one solid state light emitter with a narrow spectral output may comprise a dominant wavelength in the green spectrum. In certain embodiments, multiple solid state light emitters having different dominant wavelengths may include a narrow spectral output with a full width-half maximum emission value of no greater than 30 nm. In certain embodiments, all solid state light emitters of a lighting device may include a narrow spectral output with a full width-half maximum emission value of no greater than 30 nm. In certain embodiments, a lighting device may include electrically activated solid state light emitters having dominant wavelengths in the following three ranges: a first range of from 485 nm to 505 nm (or in a range of from 491 nm to 505 nm in certain embodiments), a second range of from 526 nm to 545 nm, and a third range of from 615 nm to 625 nm. In certain embodiments, a lighting device may be devoid of solid state light emitters having dominant wavelengths outside the foregoing dominant wavelength ranges (e.g., below 485 nm (or below 491 nm), in a range of from 546 nm to 614 nm, or above 625 nm).

In certain embodiments, a solid state lighting device includes electrically activated solid state light emitters including different solid state light emitters arranged to generate emissions having dominant wavelengths in a first wavelength range, in a second wavelength range, and in a third wavelength range, wherein the second dominant wavelength exceeds the first dominant wavelength by at least 20 nm, and wherein the third dominant wavelength exceeds the second dominant wavelength by at least 60 nm. In certain embodiments, multiple electrically activated solid state emitters may be provided for each dominant wavelength range.

In certain embodiments, a lighting device may include a plurality of electrically activated solid state light emitters including: at least one first electrically activated solid state light emitter comprising a dominant wavelength in a range of from 485 nm to 505 nm (or from 491 nm to 505 nm in certain embodiments); at least one second electrically activated solid state light emitter comprising a dominant wavelength in a range of from 526 nm to 545 nm; and at least one third electrically activated solid state light emitter comprising a dominant wavelength in a range of from 615 nm to 625 nm; wherein the at least one second electrically activated solid state light emitter comprises a narrow spectral output with a full width-half maximum emission value of no greater than 30 nm.

In certain embodiments, a lighting device may include a plurality of electrically activated solid state light emitters including: at least one first electrically activated solid state light emitter comprising a first dominant wavelength; at least one second electrically activated solid state light emitter comprising a second dominant wavelength; and at least one third electrically activated solid state light emitter comprising a third dominant wavelength; wherein at least one of the first, the second, and the third electrically activated solid state light emitter comprises a narrow spectral output with a full width-half maximum emission value of no greater than 30 nm; wherein aggregate emissions of the lighting device comprise a gamut area index (GAI) value in a range of from 80 to 100; and wherein aggregate emissions of the lighting device comprise a correlated color temperature, and comprise a scotopic/photopic ratio in at least one of the following ranges: a value of at least 0.000042 times the correlated color temperature, plus 0.53; a value of at least 0.000045 times the correlated color temperature, plus 0.57; a value of at least 0.000048 times the correlated color temperature, plus 0.62; and a value of at least 0.000069 times the correlated color temperature, plus 0.14.

In certain embodiments, multiple clusters of electrically activated solid state light emitters may be provided, wherein each cluster of the plurality of clusters includes a first electrically activated solid state light emitter within a first dominant wavelength range disclosed herein, a second electrically activated solid state light emitter within a second dominant wavelength range disclosed herein, and a third electrically activated solid state light emitter within a third dominant wavelength range disclosed herein.

In certain embodiments, a lighting device including a plurality of electrically activated solid state light emitters may include one, some, or all of the following features: a single leadframe arranged to conduct electrical power to the plurality of electrically activated solid state light emitters; a single reflector arranged to reflect at least a portion of light emanating from the plurality of electrically activated solid state light emitters; a single submount or mounting element supporting the plurality of electrically activated solid state light emitters; a single lens arranged to transmit at least a portion of light emanating from the plurality of electrically activated solid state light emitters; and a single diffuser arranged to diffuse at least a portion of light emanating from the plurality of electrically activated solid state light emitters.

Figures 3, 4:
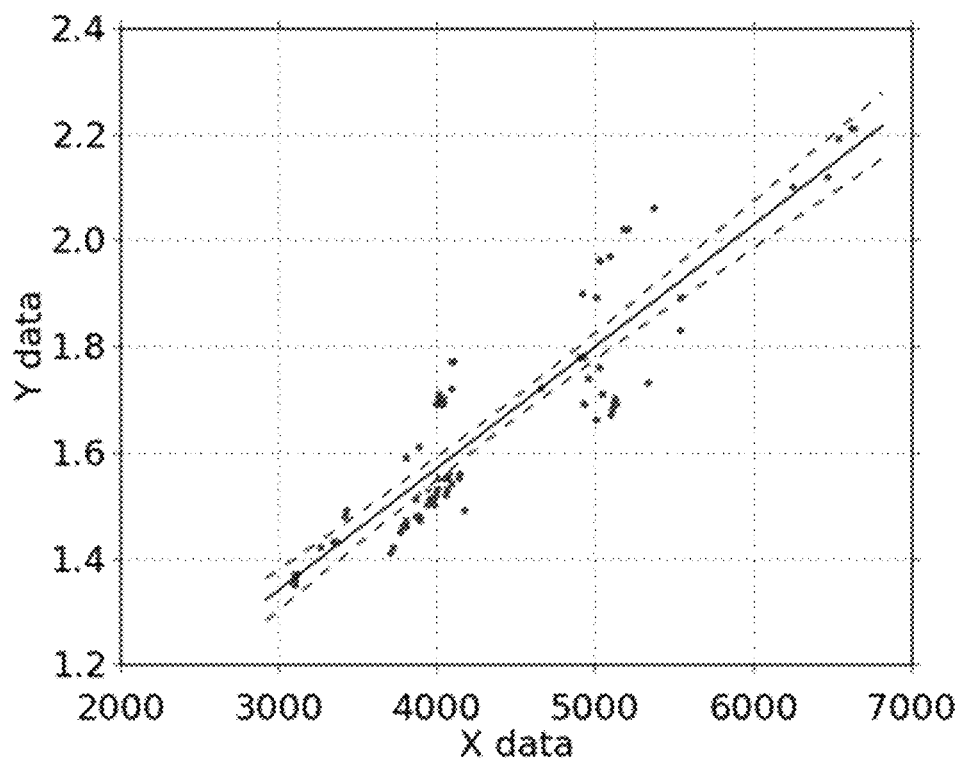
FIG. 3 is a plot of S/P ratio versus CCT for 90 tests of white LED-based roadway and area lighting luminaires (each including at least one phosphor-converted LED) performed by LightLab International Inc.
FIG. 4 is a table of recommended value ranges for S/P ratios as a function of CCT for white LED-based light sources (each including one phosphor-converted LED) derived from the data points plotted in FIG. 3, with each range including an empirical low value and an empirical high value.

FIG. 3 is a plot of S/P ratio versus CCT for 90 tests of white LED-based roadway and area lighting luminaires (each including at least one phosphor-converted LED) performed by LightLab International Inc. (Source: http://agi32.com/blog/category/mesopic-lighting/.) FIG. 4 is a table of recommended value ranges for S/P ratios as a function of CCT for white LED-based light sources (each including one phosphor-converted LED) derived from the data points plotted in FIG. 3, with each range including an empirical low value and an empirical high value. FIGS. 3 and 4 demonstrate that S/P ratio for white LED-based luminaires including at least one phosphor-converted LED generally increases with increasing CCT.

FIG. 5 is a table identifying (i) approximate S/P ratio and GAI values at six color temperatures from 2700K to 5000K for a conventional white LED-based source (including a red LED, blue LED, blue LED arranged to stimulate yellow phosphor) to produce aggregate emissions along the blackbody locus; (ii) corresponding S/P ratio and GAI values for a modeled solid state lighting device including red/orange, cyan, and narrow spectral output green solid state ("narrow green" modeling results); (iii) comparisons between the S/P ratio values and GAI values for the conventional white LED source and the narrow green source. The modeled "narrow green" device included a red/orange LED having a dominant wavelength in a range of from 615 nm to 625 nm, a cyan LED having a dominant wavelength in a range of from 485 nm to 505 nm (including the subrange of from 491 nm to 505 nm), and a green LED having a dominant wavelength in a range of from 526 to 545 nm, with the green LED including a narrow spectral output with a full width—half maximum emission value of less than 30 nm. The second and third columns of FIG. 5 show that the conventional LED-based source exhibits S/P ratio values in a range of from 1.2 to 1.8 and GAI values in a range of from 55 to 100, with S/P ratio and GAI values increasing steadily with increasing CCT from 2700K to 5000K. The fourth and fifth columns of FIG. 5 show that the "narrow green" source exhibits S/P ratio values in a range of from 2 to 3.6 and GAI values in a range of from 49 to 84, with S/P ratio and GAI values increasing steadily with increasing CCT from 2700K to 5000K. In certain embodiments, maximum S/P ratio values may exceed the values shown in FIG. 5 by 5%, by 10%, by 15%, by 20%, or some other threshold value. As shown in the rightmost two columns of FIG. 5, S/P ratio of the "narrow green" source exhibited S/P ratio increases from 67% to 100% (depending on color temperature) relative to the conventional LED-based source, with GAI values that are slightly diminished relative to the conventional LED-based source (e.g., in a range of from 49 to 84 that increases with CCR, representing a range of from 84% to 96% of the GAI values of emissions of the conventional LED-based source).

FIG. 6 is a table comparing (a) S/P ratios for the empirical low range and empirical high range results summarized in FIG. 4 over a range of five CCT values from 2700K to 5000K (b) S/P ratios for the modeled "narrow green" lighting device summarized in FIG. 5 over a range of five CCT values from 2700K to 5000K. The empirical low range and empirical high range S/P ratio values generally agree with the S/P ratio values for the conventional LED-based device provided in FIG. 5, except at a CCT value of 5000K where the S/P ratio value of 1.8 for the conventional LED-based device is slightly below the empirical S/P ratio values of from 1.9 to 2.2 identified in FIG. 6. The fifth column of FIG. 6 shows that the modeled "narrow green" lighting device provides emissions with S/P ratio values over a range of CCT from 2700K to 5000K that exceed the empirical low range S/P ratio values by 82% to 114%, whereas the sixth column of FIG. 6 shows that the modeled "narrow green" lighting device provides emissions with S/P ratio values over the same CCT that exceed the empirical high range S/P ratio values by 43% to 67%.

Figure 7:
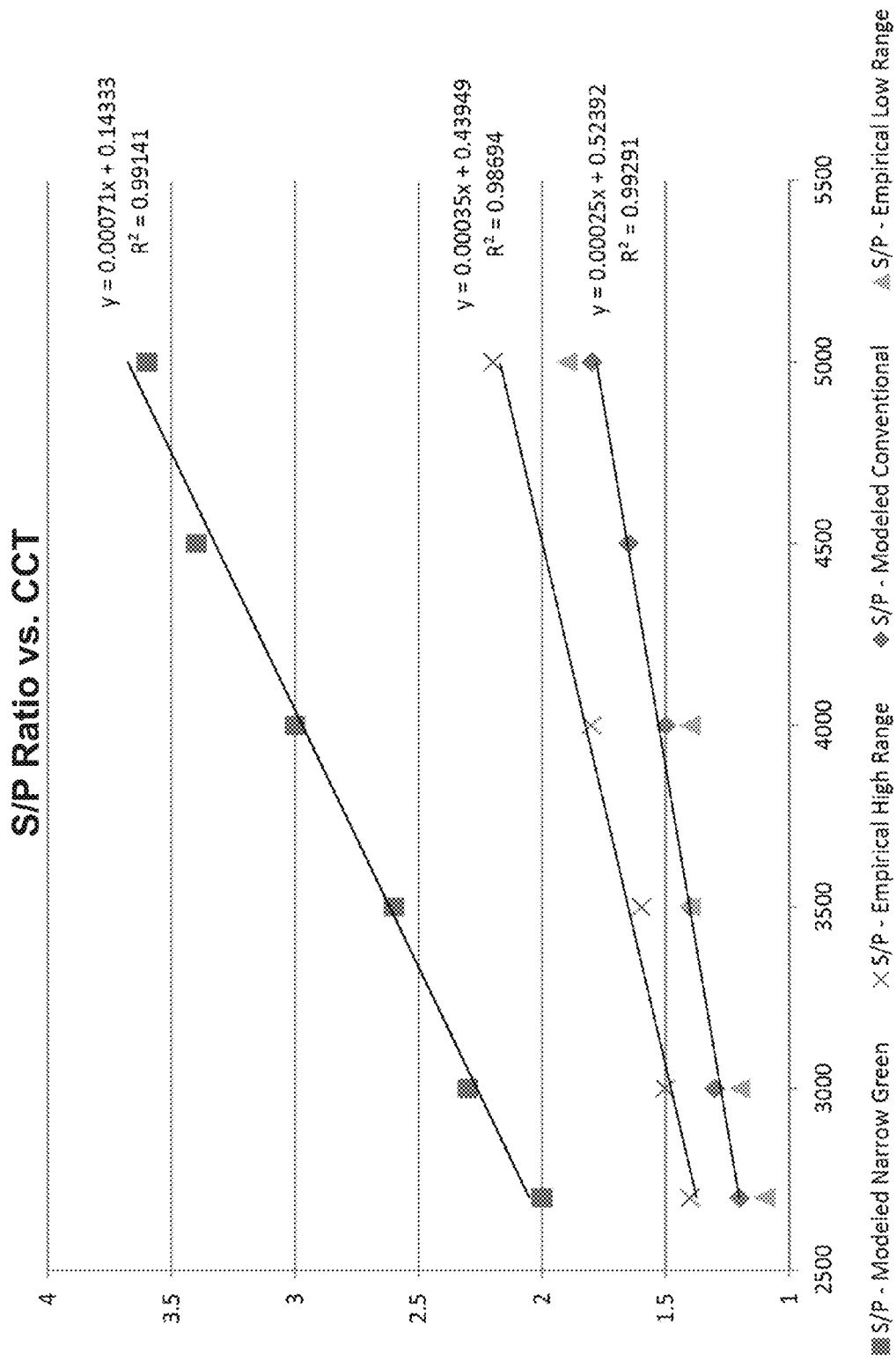
FIG. 7 embodies four plots of S/P ratio versus CCT for (i) the modeled "narrow green" solid state lighting device summarized in FIG. 5, (ii) the modeled conventional white LED-based source summarized in FIG. 5; (iii) the empirical high range white LED-based light source summarized in FIG. 4, and (iv) the empirical low range white LED-based light source summarized in FIG. 4, with inclusion of linear trendlines and linear trendline functions for series (i), series (ii), and series (iii).

FIG. 7 embodies four plots of S/P ratio versus CCT for (i) the modeled "narrow green" solid state lighting device summarized in FIG. 5, (ii) the modeled conventional white LED-based source summarized in FIG. 5; (iii) the empirical high range white LED-based light source summarized in FIG. 4, and (iv) the empirical low range white LED-based light source summarized in FIG. 4, with inclusion of linear trendlines and linear trendline functions for series (i), series (ii), and series (iii). The trendline function for the empirical high range white LED-based light source is y=0.00035x+ 0.43949 (with reasonable correlation demonstrated by the $R^2$ value of 0.98694), and the trendline function for the modeled "narrow green" source is y=0.00071x+0.1433 (with reasonable correlation demonstrated by the $R^2$ value of 0.99141). In each of the preceding trendlines, "x" represents CCT. As shown in FIG. 7, all S/P values in series (i) and the slope of the trendline for series (i) are significantly higher than the S/P values and the trendline slopes for any other series.

Figure 8:
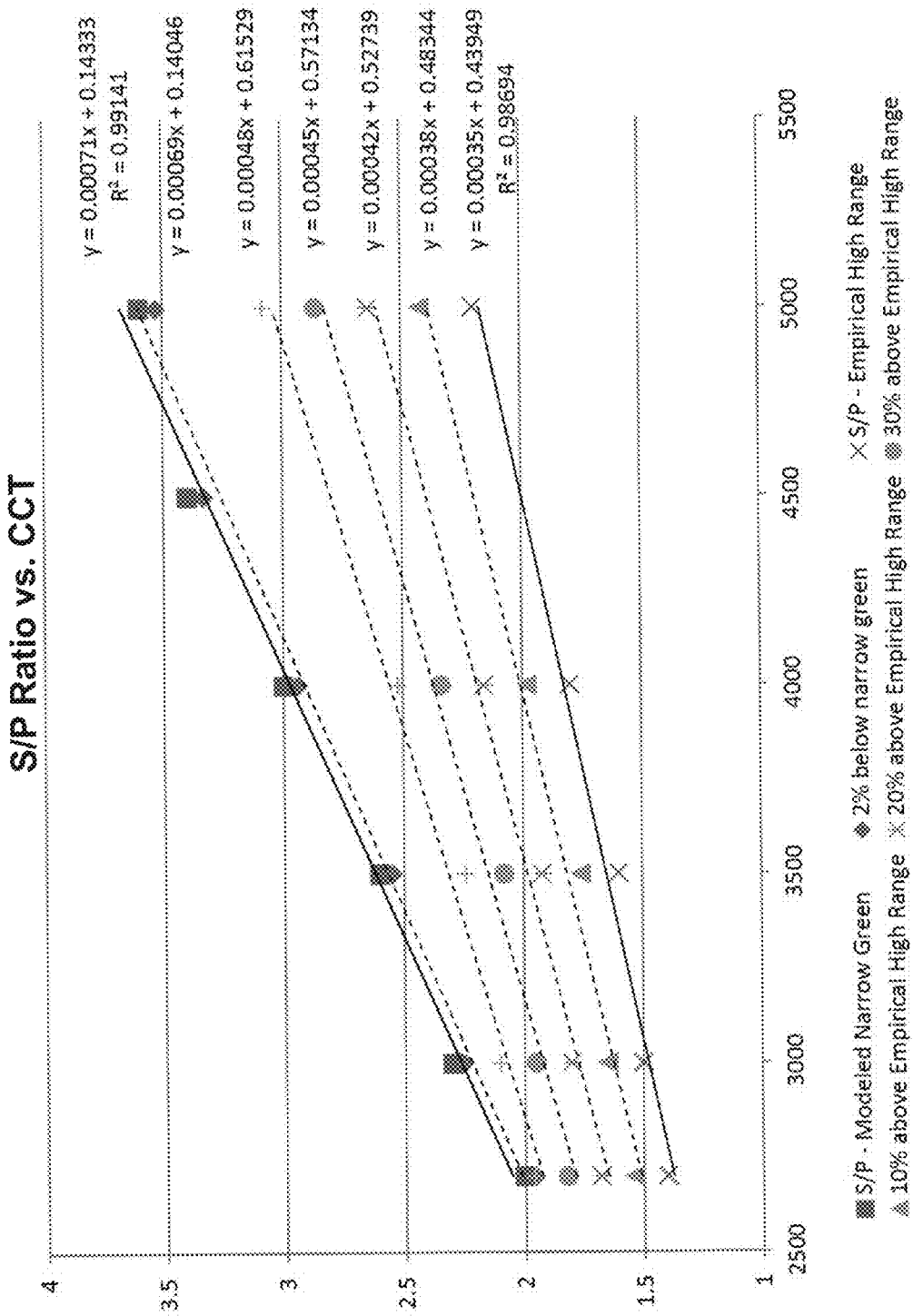
FIG. 8 includes plots of S/P ratio versus CCT for the modeled "narrow green" solid state lighting device and for the empirical high range white LED-based light source of FIG. 7, with four intermediate plots including values offset above the empirical high range white LED-based light source plot by 10%, 20%, 30%, and 40%, and a fifth intermediate plot including values offset below the modeled "narrow green" solid state lighting device by 2%, including linear trendlines and linear trendline functions for each series.

FIG. 8 includes plots of S/P ratio versus CCT for the modeled "narrow green" solid state lighting device and for the empirical high range white LED-based light source of FIG. 7, with four intermediate plots including values offset above the empirical high range white LED-based light source plot by 10%, 20%, 30%, and 40%, and a fifth intermediate plot including values offset below the modeled "narrow green" solid state lighting device by 2%, including linear trendlines and linear trendline functions for each series. The second intermediate plot is offset above the empirical high range white LED-based light source by 10%, and includes a linear trendline function of 0.000042 times the correlated color temperature, plus 0.53. The third intermediate plot is offset above the empirical high range white LED-based light source by 20%, and includes a linear trendline function of 0.000045 times the correlated color temperature, plus 0.57. The fourth intermediate plot is offset above the empirical high range white LED-based light source by 30%, and includes a linear trendline function of 0.000048 times the correlated color temperature, plus 0.62. The fifth intermediate plot is offset below the modeled "narrow green" solid state lighting device by 2%, and includes a linear trendline function of 0.000069 times the correlated color temperature, plus 0.14. Notably, all data points of the modeled "narrow green" solid state lighting device are at or above the trendline for the fifth intermediate plot. As noted previously, the "narrow green" modeling results embody enhanced S/P ratio relative to the empirical high range results summarized in FIG. 4. Any one or more of the foregoing five intermediate plots and the corresponding trendlines may be utilized as minimum thresholds for S/P ratio as a function of CCT for novel solid state lighting devices disclosed herein.

Figure 9A:
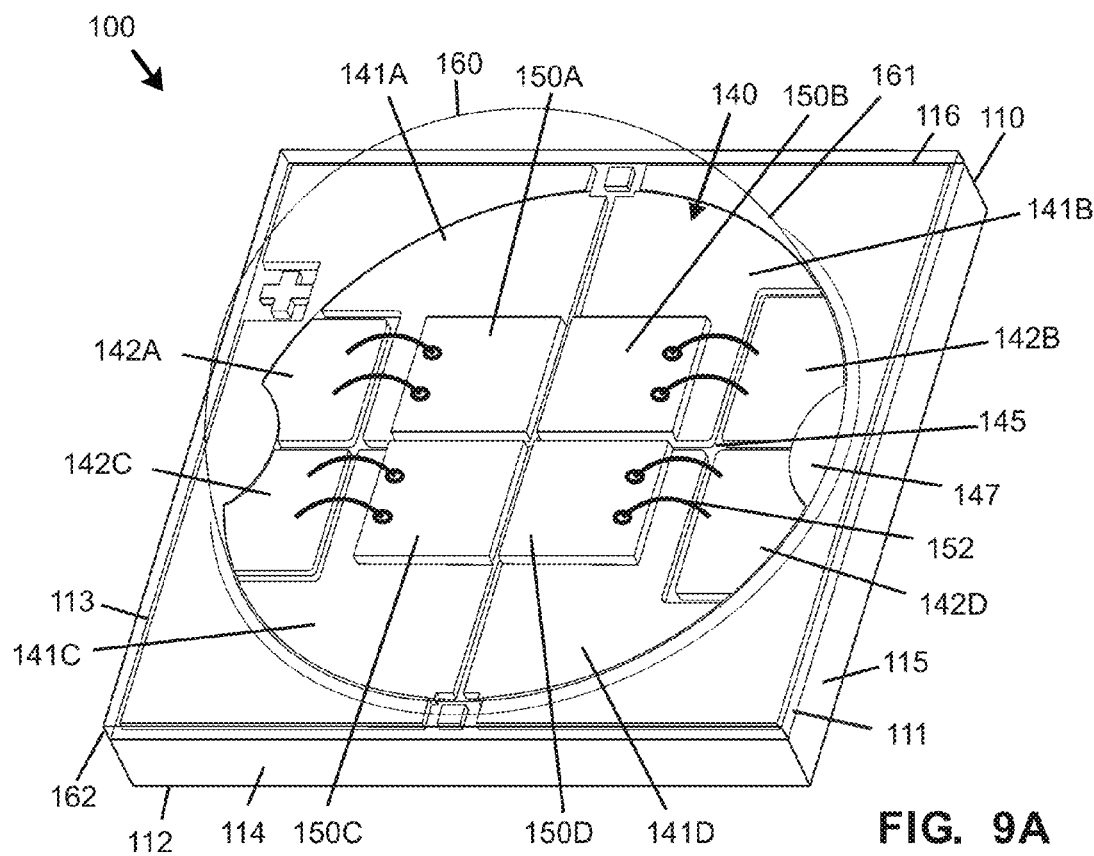
FIG. 9A is a top perspective view of a solid state emitter package including four solid state emitter chips arranged over a substrate, covered with a hemispherical lens, and connected to electrical traces via wirebonds.

In certain embodiments, solid state lighting devices as disclosed herein, including multiple electrically activated solid state emitters, may be embodied in one or more solid state emitter packages. FIG. 9A illustrates a solid state emitter package 100 including multiple solid state light emitters as described herein. The emitter package 100 includes multiple (e.g., four) LED chips 150A-150D that may be separately controlled (e.g., via backside anodes 121A-121D and cathodes 122A-122D) and that are supported by an insulating substrate 110. The substrate 110, which may preferably comprise a ceramic material, includes an upper surface 111, a lower surface 112, and side walls 113-116 extending between the upper surface 111 and the lower surface 112. Electrical traces 140 are arranged over the substrate 110, including multiple die attach pads 141A-141D and additional electrical elements 142A-142D arranged proximate to the die attach pads 141A-141D. Where the die attach pads 141A-141D are electrically conductive, the LED chips 150A-150D may be arranged with bottom side contacts thereof in electrical communication with the die attach pads 141A-141D, and with top side contacts thereof in electrical communication with the electrical elements 142A-142D by way of wirebonds 152. The die attach pads 141A-141D and electrical elements 142A-142D may comprise one or more metals patterned on (or in) the upper surface 111 of the substrate 110. Gaps 145 may be provided between adjacent die attach pads 141A-141D and/or electrical elements 142A-142D to prevent undesired conductive electrical communication. In certain embodiments, die attach pads need not be electrically conductive, such as in cases where anode and cathode connections to a solid state emitter chip are both made with wirebonds. An insulating soldermask 147 is patterned over peripheral portions of the electrical traces 140, and a molded lens 160 (e.g., including a raised or hemispherical portion 161 and a base portion 162) is arranged over the top surface 111 of the substrate 110 and is arranged to transmit at least a portion of light generated by the emitter chips 150A-150D.

LED chips 150A-150D of any suitable dominant wavelength (e.g., color) may be used. In certain embodiments, each LED and the lighting device may be devoid of lumiphoric material. In alternative embodiments, one or more LED chips 150A-150D may be arranged to stimulate emissions of one or more lumiphoric materials (e.g., phosphors). In certain embodiments, some or all of the LED chips 150A-150D may be separately controlled. In alternative embodiments, groups of two or more LED chips 150A-150D may be controlled together in a groupwise fashion. Although four LED chips 150A-150D are illustrated in FIG. 9A, it is to be appreciated that a LED package may include any desirable number of LED chips, including groups of chips arranged in series, in parallel, or in series-parallel configurations.

Figure 9B:
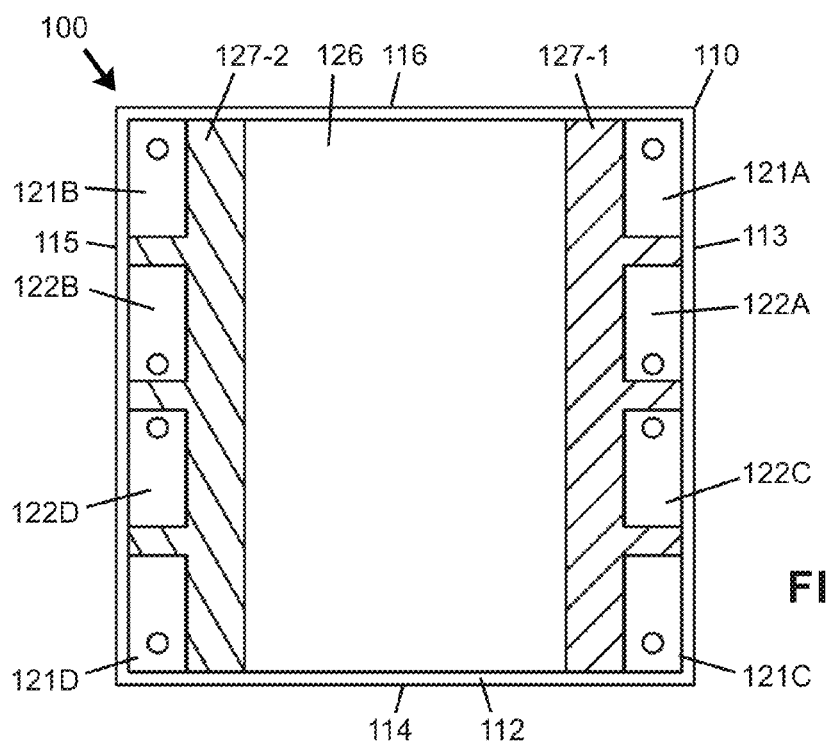
FIG. 9B is a bottom plan view of the solid state emitter package of FIG. 9A including four anodes and four cathodes arranged along opposing sides of a substrate, and including a thermally conductive contact pad arranged between the anodes and cathodes.

FIG. 9B is a bottom plan view of each of the emitter package 100 of FIG. 9A. A lower surface 112 of the substrate includes four anodes 121A-121D and four cathodes 122A-122D patterned thereon (e.g., as electrical traces), with one paired anode/cathode per quadrant. The separate anodes 121A-121D and cathodes 122A-122D enable separate control of the multiple solid state emitters (e.g., LED chips) 150A-150B if desired. The various anodes 121A-121D and cathodes 122A-122D are separated by gaps that may be filled with solder mask material sections 127-1, 127-2. A thermal element (e.g., thermal spreading element) 126 may be arranged along the bottom surface 112 between the solder mask material sections 127-1, 127-2 and generally underlapping the solid state emitters 150A-150D. The thickness of the thermal element 126 may be the same as or different from (e.g., thicker than) the anodes 121A-121D and cathodes 122A-122D. In certain embodiments, color point of the lighting device may be adjusted by separately controlling different emitters (e.g., LED chips) having different emission characteristics.

Figure 10:
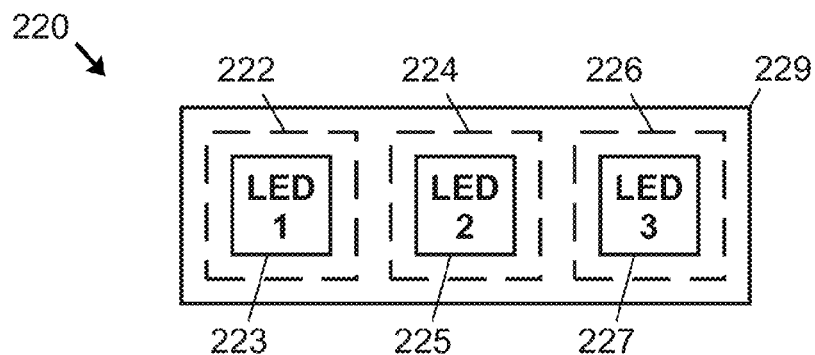
FIG. 10 is a schematic view of a first lighting device including first, second, and third solid state emitters (e.g., LEDs) arranged on a single submount or substrate.

FIG. 10 schematically illustrates a lighting emitting device 220 including first, second, and third electrically activated solid state light emitters 223, 225, 227 supported in or on a substrate or other body structure 229. Each solid state light emitter 223, 225, 227 is arranged in a different die mounting area 222, 224, 226 of the substrate or body structure 229. Each solid state light emitter 223, 225, 227 may include a dominant wavelength that differs from one another. Although FIG. 10 illustrates three solid state emitter chips 223, 225, 227, it is to be appreciated that any suitable number of solid state emitter chips may be provided according to certain embodiments.

Figure 11:
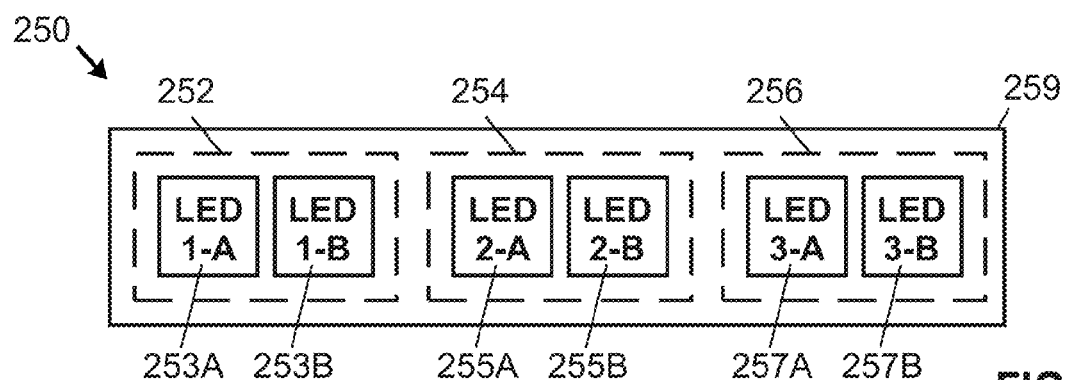
FIG. 11 is a schematic view of a second lighting device including first, second, and third groups of solid state emitters (e.g., LEDs) arranged on a single submount or substrate.

FIG. 11 schematically illustrates a light emitting device 250 including multiple groups of emitter components supported in or on a substrate or other body structure 259. A first pair of solid state emitter chips 253A, 253B is provided in a first die mounting area 252, a second pair of solid state emitter chips 255A, 255B is provided in a second die mounting area 254, and a third pair of solid state emitter chips 257A, 257B is provided in a third die mounting area 256. In certain embodiments, within each pair of solid state emitter chips the chips have substantially the same dominant wavelength, whereas between each pair of solid state emitter chips the pairs have different dominant wavelengths. In certain embodiments, the first pair of solid state emitter chips 253A, 253B may include a first dominant wavelength, the second pair of solid state emitter chips 255A, 255B may include a second dominant wavelength, the third pair of emitter chips 257A, 257B may include a third dominant wavelength, whereas the second dominant wavelength may exceed the first dominant wavelength by at least 20 nm, and the third dominant wavelength may exceed the second dominant wavelength by at least 60 nm. In certain embodiments, any suitable number of LED chips may be provided in the light emitting device 250 and supported by the substrate or body structure 259.

With general reference to FIGS. 10-11, the devices 220, 250 may embody any suitable solid state light chips, features, and/or capabilities as described herein. Additional emitter components (not shown) including one or more solid state light chips may be further provided in or on the substrate in each instance. In certain embodiments, different solid state light emitter chips may be separately arranged to produce different color points, and a mixture of light generated by the respective solid state emitter chips for each device may be arranged to yield an aggregate color point. In certain embodiments, adjustment of current or current pulse width to different solid state emitter chips may be used to adjust color point and/or intensity of aggregate emissions according to different operating states.

Figure 12:
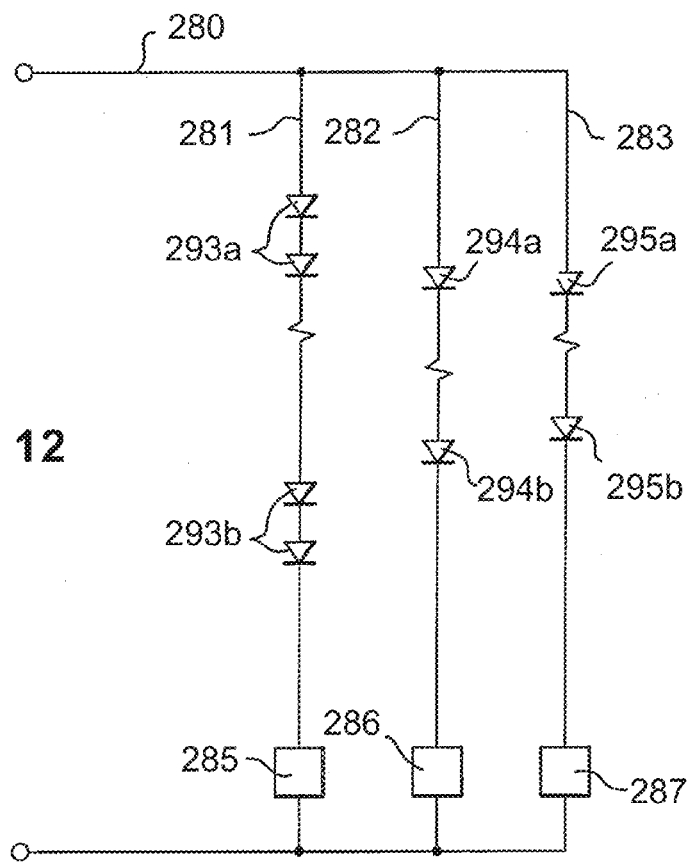
FIG. 12 illustrates a portion of a first control circuit arranged to control multiple strings of solid state emitters (e.g., LEDs).

FIG. 12 illustrates a portion of a control circuit arranged to control multiple strings 281, 282, 283 of solid state light emitters (e.g., LEDs) 293a, 293b, 294a, 294b, 295a, 295b all electrically connected to a common power line 280. Connected to the first string 281 are a first current regulating element 285 and a first group of LEDs 293A, 293B, which may be arranged to output the same of different dominant wavelengths, and may optionally be arranged to stimulate emissions of one or more lumiphoric materials. Connected to the second string 282 are a second current regulating element 286 and a second group of LEDs 294A, 294B, which may be arranged to output the same of different dominant wavelengths, and may optionally be arranged to stimulate emissions of one or more lumiphoric materials. Connected to the third string 283 are a third current regulating element 287 and a third group of LEDs 295A, 295B, which may be arranged to output the same of different dominant wavelengths, and may optionally be arranged to stimulate emissions of one or more lumiphoric materials. The current regulating elements 285-287 may be used to regulate currents through the respective strings 281-283 to any desired value. Such regulating elements 285-287 may be adjustable in certain embodiments. In certain embodiments, the number of LEDs in each string 281-283 may be the same or different. If the strings 281-283 have different emission characteristics, then the strings 281-283 may be separately controlled to adjust aggregate emissions of a lighting device.

Figure 13:
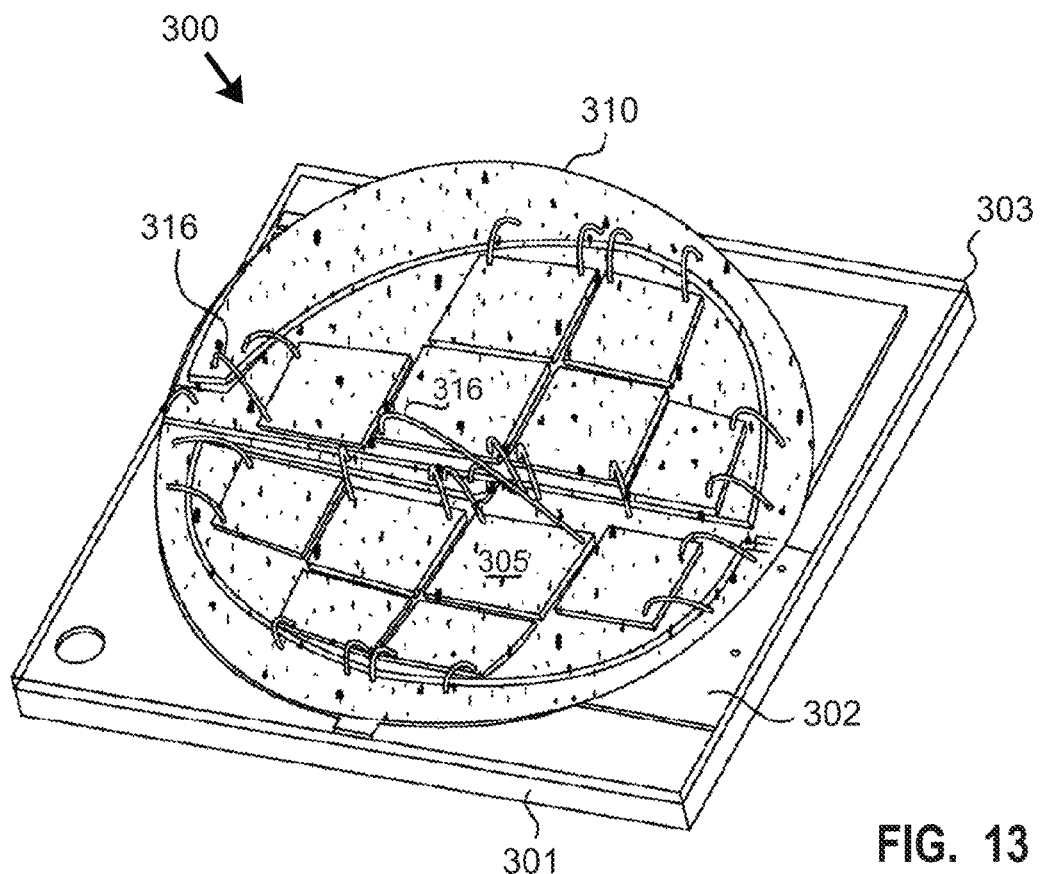
FIG. 13 is a side cross-sectional view of at least a portion of a solid state lighting emitting device including multiple solid state emitter chips coated with multiple functional materials and arranged under a hemispherical optical element.

FIG. 13 illustrates a solid state emitter package 300 including multiple solid state emitter (e.g., LED) chips 305 arranged over a submount 301 coupled to electrical traces or metal patterns 302 via wirebonds 316 and arranged under a hemispherical optical element (e.g., lens) 310. The lens 310 includes a substantially planar extension 303 along that overlies the submount 301. As shown, twelve emitter chips 305 are provided in contact with the metal traces 302 arranged over the submount 301, and cathodes of the LED chips are connected by wirebonds 316 to traces 302. In certain embodiments, the optical element 310 may include one or more functional materials, such as lumiphoric material, notch filtering material, and/or scattering material, which may be doped, coated, or otherwise provided in or on the optical element 310. The emitter chips 305 may be selected from dominant wavelengths to provide a combined light output with appropriate color point, S/P ratio, and gamut area characteristics for a desired application. In certain embodiments, the efficiency of such a light emitting package 300 may be at or above 100 lm/W. Preferably, the package 300 is arranged to provide aggregate emissions with high S/P ratio and reasonably high GAI values, preferably in combination with high brightness and high luminous efficacy.

Figure 14:
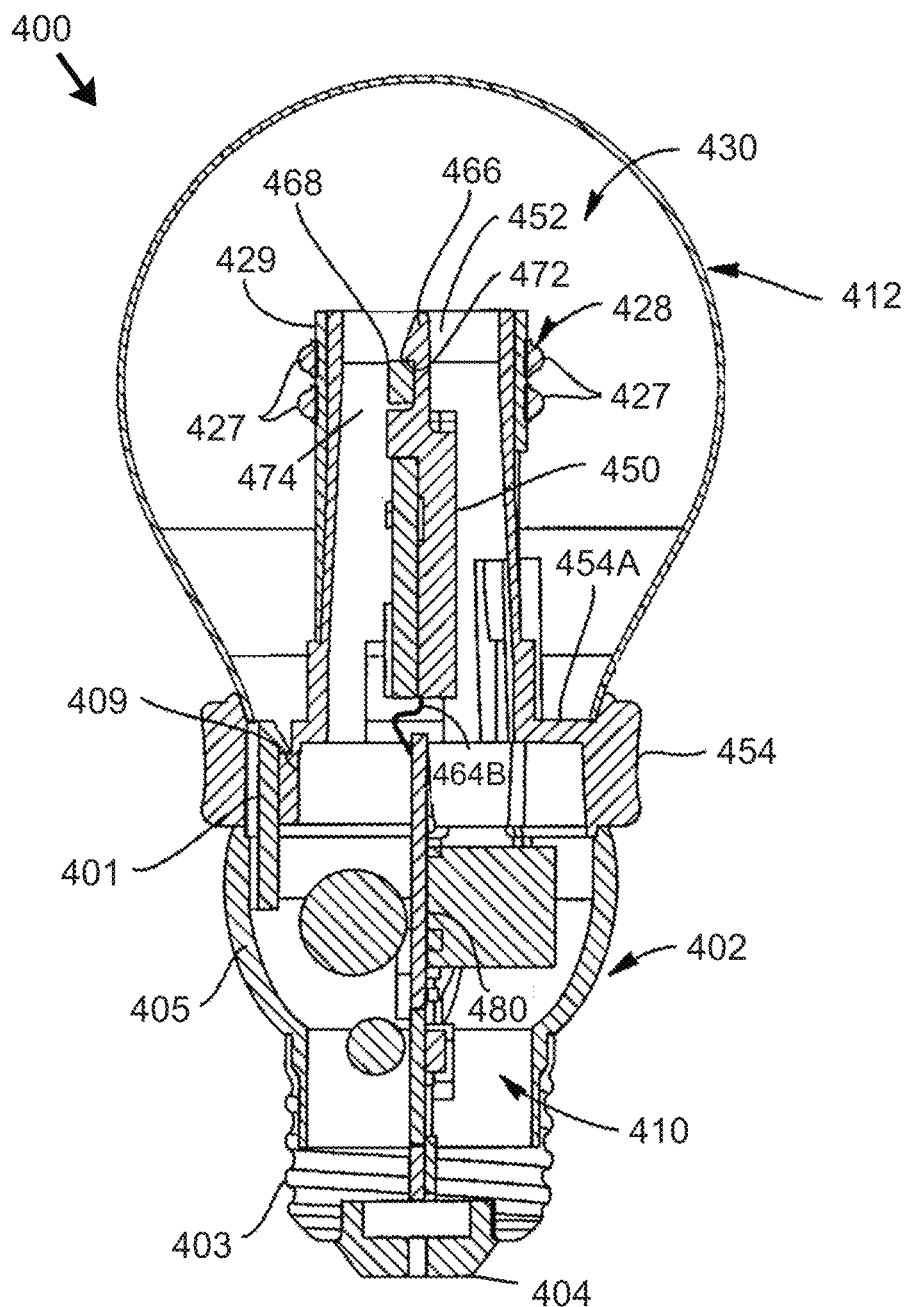
FIG. 14 is a perspective view of at least a portion of a solid state emitter package including multiple solid state emitter chips, with the chips coupled to electrical traces via wirebonds and arranged under a hemispherical optical element.

FIG. 14 illustrates a light bulb arranged to incorporate multiple solid state light emitters (e.g., LEDs) 427 as disclosed herein disposed in an array 428 in a tower-type configuration, such as disclosed in U.S. Patent Application Publication No. 2013/0271991 to Hussell et al. (incorporated by reference herein). The bulb 400 may embody an A-series bulb with an Edison base 402 including a lateral contact 403 and a foot contact 404. The base 402 may include a base printed circuit board 480 and electronics 410 within a housing 405, suitable for powering the bulb 400 and including a power supply and/or driver.

The bulb 400 includes multiple LEDs 427 (of which one or more may optionally include lumiphoric material) mounted on an upwardly-extending substantially tubular or tube-like submount (e.g., printed circuit board) 429 bounding an internal cavity 474. The LED chips 427 are operable to emit light when energized. The cavity 474 is capped by a heat conducting portion 452 that and engaging member 468 that fits with an engagement portion 466 associated with locking member 472 extending upward from an electrical interconnect 450 internal to the cavity 474. A globe-like enclosure (which may embody an optical element) 412 surrounds an interior volume containing a LED assembly 430 including the multiple emitter chips 427. A heatsink 454 is arranged between the enclosure 412 and the base 402, with a lock member 409 arranged to receive and retain deformable fingers 401 during assembly of the bulb 400. A bottom edge of the enclosure 412 abuts a top surface 454A of the heatsink 454. Internal conductors 464B are arranged to conduct electrical signals between the base PCB 480 and components of the LED assembly 430.

In certain embodiments, the optical element 412 may include light scattering and/or lumiphoric materials in certain embodiments. Different emitter chips 427 or groups thereof may be arranged to generate emissions having different color points, such that by separately controlling different emitter chips or groups thereof, color point of aggregated emissions may be varied. Preferably, the bulb 400 is arranged to provide aggregate emissions with high S/P ratio and reasonably high GAI values, preferably in combination with high brightness and high luminous efficacy.

Figure 15A:
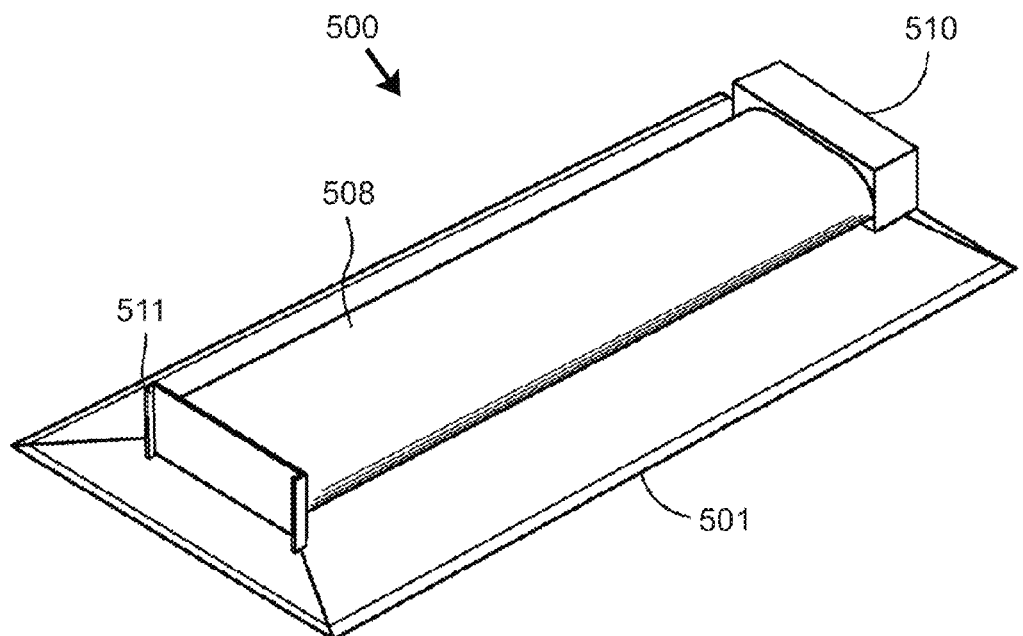
FIG. 15A is an upper perspective view of a troffer-type light fixture arranged to incorporate multiple solid state emitter chips as disclosed herein.
Figure 15B:
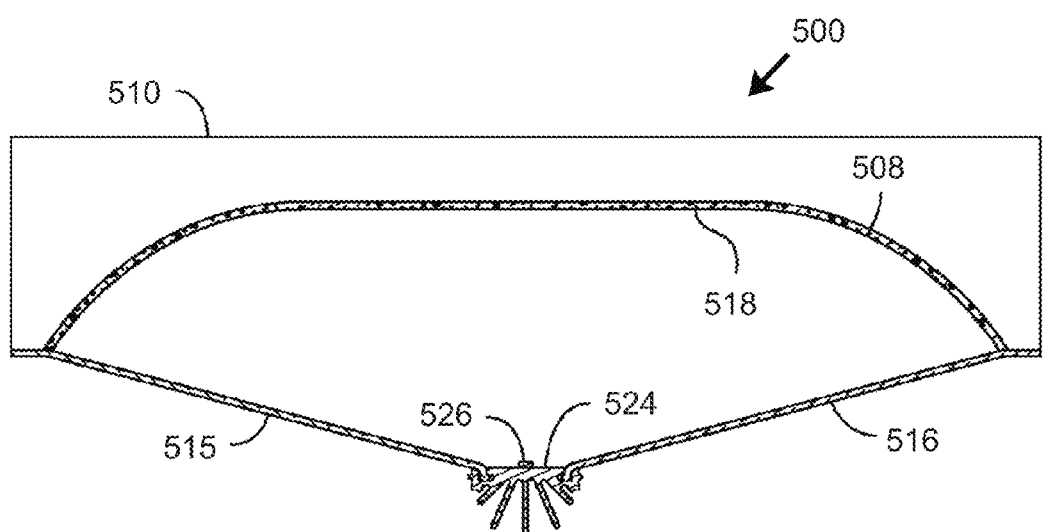
FIG. 15B is a side cross-sectional view of a portion of the light fixture of FIG. 15A.

FIGS. 15A-15B illustrate a troffer-type (in-ceiling linear) light fixture 500 arranged to incorporate multiple solid state emitter chips (e.g., LEDs) 526 as disclosed herein. Light fixture 500 includes pan 501, heatsink 502, reflector 508, and end caps 510, 511. End cap 510 is larger than end cap 511 and is shaped to act as a circuit box to house electronics used to drive and control the light source (e.g., rectifiers, regulators, timing circuitry, etc.). Although a reflector may take various shapes, in the illustrated embodiment, the reflector 508 includes a flat region opposite the heatsink 502. In alternative embodiments, the reflector 508 could be parabolic in shape, or include two or more parabolic regions. Light fixture 500 also includes a diffuser lens assembly including lens plates 515, 516, disposed adjacent to sides of the heatsink 502. Reflector 508 can be made of many different materials, including metal, polymeric material, microcellular polyethyleneterephthalate (MCPET), or other suitable materials. In certain embodiments, the reflector 508 may include a coating 518, which may embody one or more filtering materials such as neodymium oxide, another rare earth metal oxide, and/or a color filtering material in order to cause reflected emissions to exhibit a spectral notch. Multiple emitter chips 526 or groups thereof (optionally in conjunction with lumiphoric material and/or notch filtering material) may having different dominant wavelengths, and arranged to provide aggregate emissions having S/P ratio, gamut area, and other properties as disclosed herein. The emitter chips 526 may be mounted to a submount or other substrate 524 arranged along an upper surface 524 of the heatsink 502. Preferably, the fixture 500 is arranged to provide aggregate emissions with high S/P ratio and reasonably high GAI values, preferably in combination with high brightness and high luminous efficacy.

Figure 16:
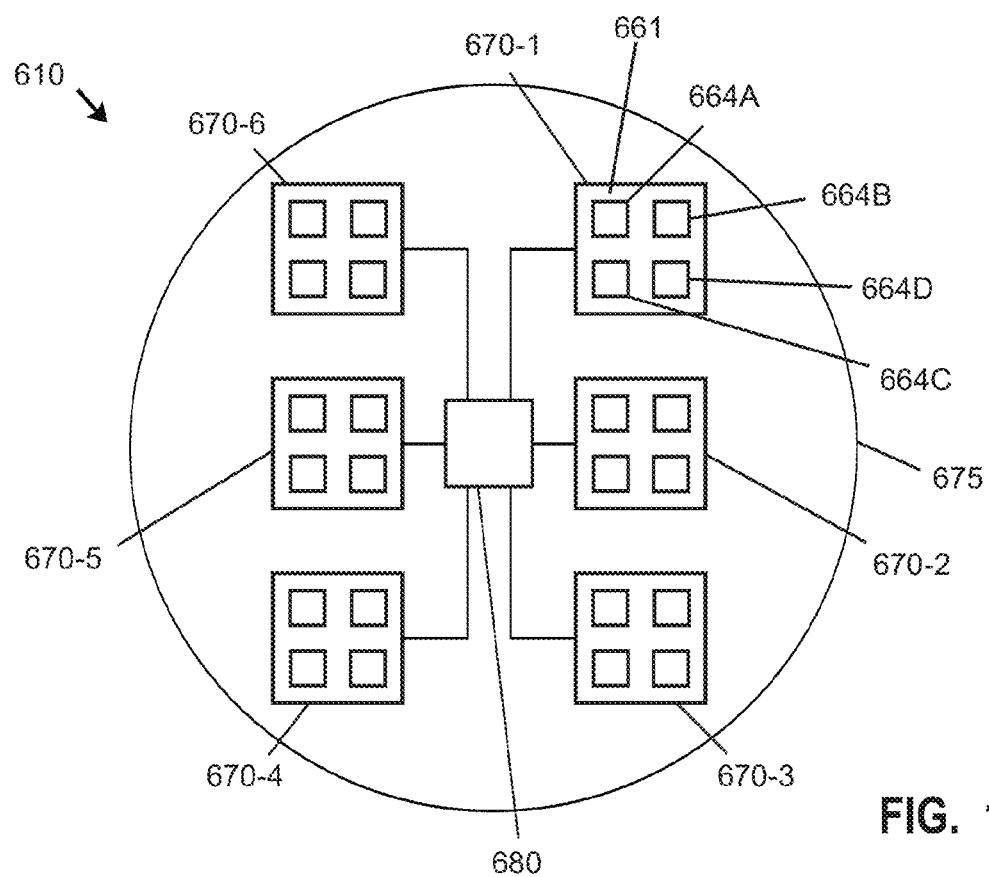
FIG. 16 is a simplified plan view of a light emitting apparatus including multiple LED components and at least one control circuit.

FIG. 16 illustrates a lighting apparatus (e.g., light fixture) 610 according to at least one embodiment. The apparatus 610 includes a substrate or mounting plate 675 to which multiple solid state emitter (e.g., LED) lamps 670-1 to 670-6 (optionally embodied in multi-chip lamps such as multi-chip LED packages) are attached, wherein each lamp 670-1 to 670-6 may include multiple LEDs as described herein. Each lamp 670-1 to 670-6 may optionally include a cluster of solid state emitters (optionally including at least one lumiphor converted solid state emitter). The mounting plate 675 may include a circular shape or any suitable shape or configuration (including non-planar and curvilinear configurations). Different solid state emitter lamps or clusters may be configured to emit the same or different colors (e.g., wavelengths) of light. With specific reference to a first solid state lamp 670-1, each solid state lamp 670-1 to 670-6 may include multiple solid state emitters (e.g., LEDs) 664A-664D preferably arranged on a single submount 661. Although FIG. 16 illustrates four solid state emitter chips as being associated with each multi-chip solid state lamp 670-1 to 670-6, it is to be appreciated that any suitable number of solid state emitter chips may be associated with each multi-chip solid state lamp 670-1 to 670-6, and the number of solid state emitter chips associated with different (e.g., multi-chip) solid state lamps may differ. Each solid state lamp in a single fixture 610 may be substantially identical to one another, or solid state lamps with different output characteristics may be intentionally provided in a single fixture 610.

The solid state lamps 670-1 to 670-6 may be grouped on the mounting plate 675 in clusters or other arrangements so that the light fixture 610 outputs a desired pattern of light. The light fixture 610 may include one or more control circuit components 680 arranged to operate the lamps 670-1 to 670-6 by independently applying currents and/or adjusting duty cycle of respective LED components or groups thereof. In certain embodiments, individual solid state chips 664A-664D in various lamps 670-1 to 670-6 may be configured to be individually addressed by the control circuit 680. In certain embodiments, the lighting fixture 610 may be self-ballasted. In certain embodiments, a control circuit 680 may include a current supply circuit configured to independently apply an on-state drive current to each individual solid state light emitter chip responsive to a control signal, and may include one or more control elements configured to selectively provide control signals to the current supply circuit.

The control circuit 680 may be configured to control the current driven through the solid state emitter chips 664A-664D associated with the lamps 670-1 to 670-6 using one or more control schemes known in the art. The control circuit 680 may be attached to an opposite or back surface of the mounting plate 675, or may be provided in an enclosure or other structure (not shown) that is segregated from the light fixture 610. One or more heat dissipating structures (not shown) may be further associated with the fixture 610.

Figure 17:
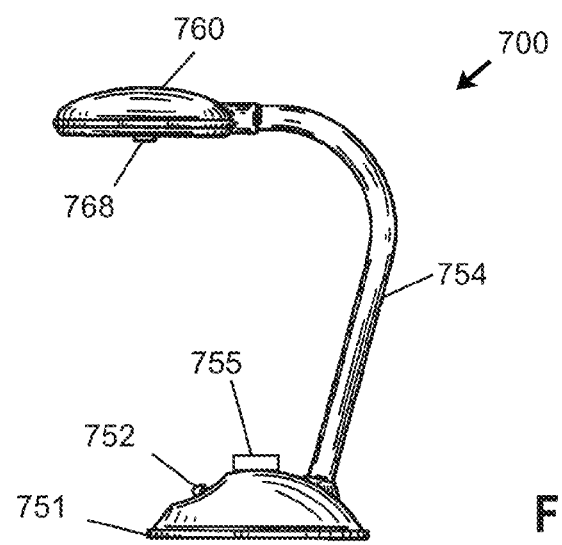
FIG. 17 is a side elevation view of a desk lamp or table lamp embodying a light emitting apparatus including multiple electrically activated solid state light emitters as described herein.

FIG. 17 illustrates an interior lamp (e.g., desk lamp or table lamp) 700 that may include multiple LEDs as described herein. The lamp 700 includes an arm 754 extending between a base 751 and a lamp head 760 that includes the LEDs 768. The base 751 may include a user input element 752 and/or one or more sensor elements 755 (e.g., photosensors) arranged to control operation (e.g., output intensity/dimming, and/or color point of aggregated emissions) of the LEDs 768. In certain embodiments, the LEDs 768 may include at least one narrow wavelength green LED in combination with other emitters to produce emissions having an elevated S/P ratio preferably in conjunction with reasonably high GAI.

Figure 18A:
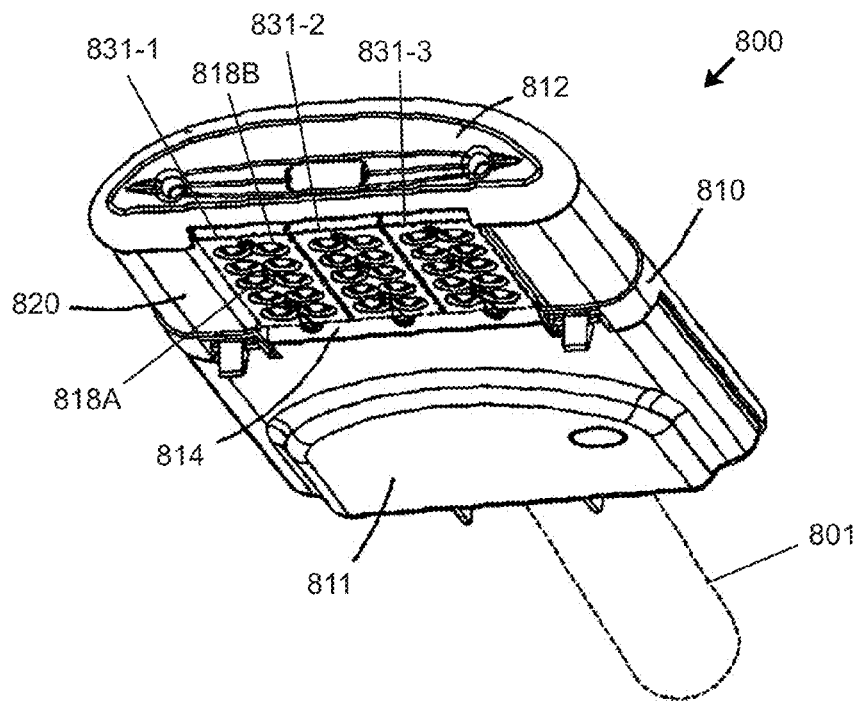
FIG. 18A is a lower perspective view of an outdoor floodlight (e.g., street or roadway lamp) embodying a light emitting apparatus including multiple electrically activated solid state light emitters as described herein.
Figure 18B:
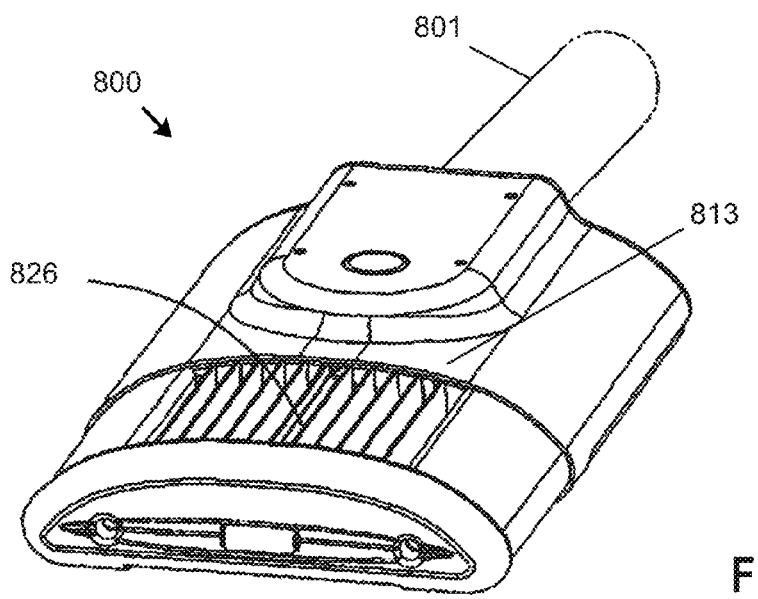
FIG. 18B is an upper perspective view of the outdoor floodlight of FIG. 18A

FIGS. 18A-18B illustrate an outdoor floodlight (e.g., street or roadway lamp) 800 that may include multiple LEDs as described herein. The lamp 800 includes a housing 810 and downwardly protruding base portion 811 supported by an elongate pole 801 or other support. Multiple LED modules 831-1, 831-2, 831-3 each including multiple LEDs 818A, 818B (e.g., comprising individual LEDs and/or LED packages components as disclosed herein) may be arranged along a lower surface 820 of the lamp 800 between the pole 801 and an end cap 812. The LED modules 831-1, 831-2, 831-3 are arranged proximate to an air gap 814 permitting heat to be dissipated to a heat spreader or heat sink 826 (arranged along an upper surface 813 of the lamp 800) and transferred to an ambient environment. In certain embodiments, different LED modules and/or groups of LEDs therein may include separate (optionally different) optical components to provide any desired output beam pattern. In certain embodiments, the LED modules 831-1, 831-2, 831-3 may include multiple narrow wavelength emitters preferably including at least one narrow wavelength emitter in the green range (e.g., preferably in combination with at least one cyan and at least one red/orange solid state emitter), providing aggregate emissions with high S/P ratio and reasonably high GAI values, preferably in combination with high brightness and high luminous efficacy.

Figure 19:
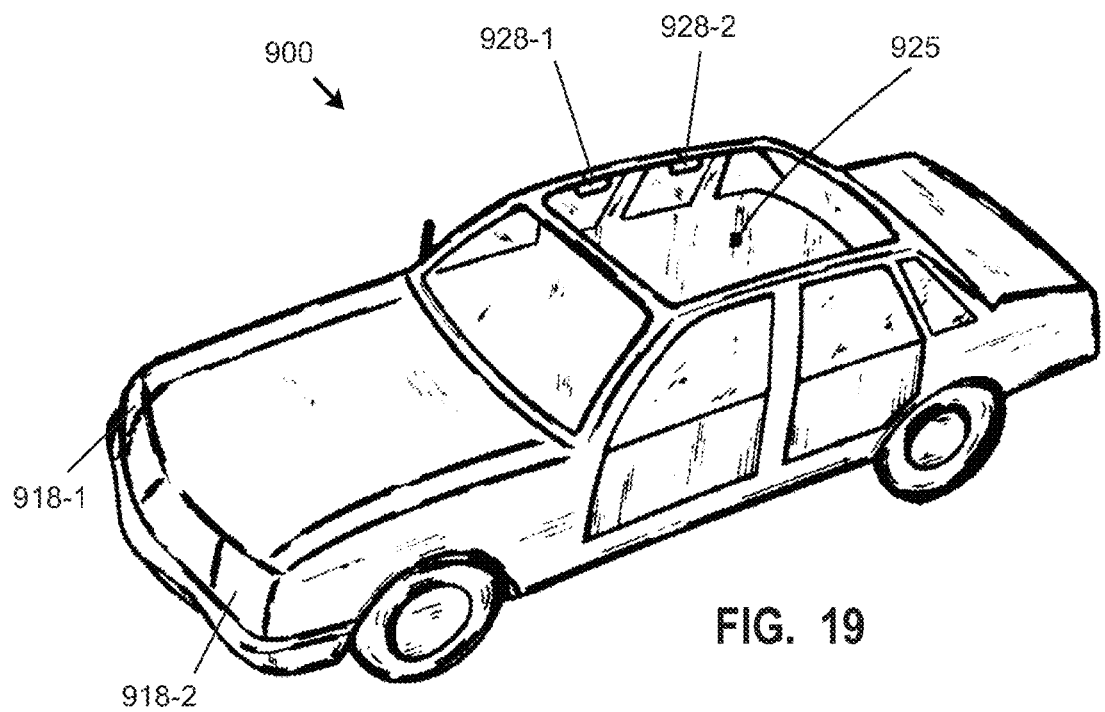
FIG. 19 is a simplified perspective view of a motor vehicle (i.e., automobile) including interior and exterior lights that may each embody a light emitting apparatus including multiple electrically activated solid state light emitters as described herein.

FIG. 19 is a simplified perspective view of a motor vehicle (i.e., automobile) 900 including headlamps 918-1, 918-2 that may each include multiple LEDs as described herein for lighting an environment and/or surface external to the vehicle 900, and including interior lamps 928-1, 928-2 that that may each include multiple LEDs as described herein for lighting the interior 925 of the vehicle 900. In certain embodiments, each headlamp 918-1, 918-2 and interior lamp 928-1, 928-2 may include multiple narrow wavelength emitters preferably including at least one narrow wavelength emitter in the green range (e.g., preferably in combination with at least one cyan and at least one red/orange solid state emitter), providing aggregate emissions with high S/P ratio and reasonably high GAI values, preferably in combination with high brightness and high luminous efficacy.

Embodiments as disclosed herein may provide one or more of the following beneficial technical effects: permitting attainment of high S/P ratio and high GAI, preferably in combination with high brightness and high luminous efficacy, using a single lighting device; providing lighting devices with high luminous efficacy and enhanced energy efficiency; increasing light output useful to humans when an lighting apparatus is utilized at nighttime or in a dimly illuminated environment; and enhancing flexibility of fabrication and operation of lighting devices.

Those skilled in the art will recognize improvements and modifications to the preferred embodiments of the present disclosure. All such improvements and modifications are considered within the scope of the concepts disclosed herein and the claims that follow. Any of the various features and elements as disclosed herein may be combined with one or more other disclosed features and elements unless indicated to the contrary herein.

What is claimed is:

1. A lighting device comprising a plurality of electrically activated solid state light emitters including:
   at least one first electrically activated solid state light emitter comprising a dominant wavelength in a range of from 485 nm to 505 nm;
   at least one second electrically activated solid state light emitter comprising a dominant wavelength in a range of from 526 nm to 545 nm; and
   at least one third electrically activated solid state light emitter comprising a dominant wavelength in a range of from 615 nm to 625 nm;
   wherein the at least one second electrically activated solid state light emitter comprises a narrow spectral output with a full width—half maximum emission value of no greater than 30 nm; and
   wherein the lighting device comprises one or more of the following features (i) to (vi):
   (i) the plurality of electrically activated solid state light emitters is arranged to generate aggregate emissions having a correlated color temperature, and having a scotopic/photopic ratio in at least one of the following ranges (a) to (d):
     (a) a value of at least 0.000042 times the correlated color temperature, plus 0.53;
     (b) a value of at least 0.000045 times the correlated color temperature, plus 0.57;
     (c) a value of at least 0.000048 times the correlated color temperature, plus 0.62; or
     (d) a value of at least 0.000069 times the correlated color temperature, plus 0.14;
   (ii) the lighting device is devoid of any electrically activated solid state light emitter comprising a dominant wavelength in a range of from 546 nm to 614 nm;
   (iii) the lighting device is devoid of any electrically activated solid state light emitter comprising a dominant wavelength in a range of greater than 625 nm;
   (iv) aggregate emissions of the lighting device comprise a gamut area index (GAI) value in a range of from 80 to 100;
   (v) the at least one first electrically activated solid state light emitter comprises multiple first electrically activated solid state light emitters;
     the at least one second electrically activated solid state light emitter comprises multiple second electrically activated solid state light emitters;
     the at least one third electrically activated solid state light emitter comprises multiple third electrically activated solid state light emitters; and
     the lighting device comprises a plurality of clusters of electrically activated solid state light emitters, wherein each cluster of the plurality of clusters includes a first electrically activated solid state light emitter of the multiple first electrically activated solid state light emitters, a second electrically activated solid state light emitter of the multiple second electrically activated solid state light emitters, and a third electrically activated solid state light emitter of the multiple third electrically activated solid state light emitters; or
   (vi) aggregate emissions of the lighting device comprise a color rendering index (CRI Ra) value in a range not exceeding 50.

2. The lighting device according to claim 1, wherein the at least one first electrically activated solid state light emitter comprises a dominant wavelength in a range of from 491 nm to 505 nm.

3. The lighting device according to claim 1, wherein the plurality of electrically activated solid state light emitters is arranged to generate aggregate emissions having a correlated color temperature, and having a scotopic/photopic ratio in at least one of the following ranges (a) to (d):
   (a) a value of at least 0.000042 times the correlated color temperature, plus 0.53;
   (b) a value of at least 0.000045 times the correlated color temperature, plus 0.57;
   (c) a value of at least 0.000048 times the correlated color temperature, plus 0.62; or
   (d) a value of at least 0.000069 times the correlated color temperature, plus 0.14.

4. The lighting device according to claim 1, wherein any of (i) the at least one first electrically activated solid state light emitter or (ii) the at least one third electrically activated solid state light emitter comprises a narrow spectral output with a full width-half maximum emission value of no greater than 30 nm.

5. The lighting device according to claim 1, wherein each of (i) the at least one first electrically activated solid state light emitter and (ii) the at least one third electrically activated solid state light emitter comprises a narrow spectral output with a full width-half maximum emission value of no greater than 30 nm.

6. The lighting device according to claim 1, being devoid of any lumiphoric material.

7. The lighting device according to claim 1, being devoid of any electrically activated solid state light emitter comprising a dominant wavelength in a range below 485 nm.

8. The lighting device according to claim 1, being devoid of any electrically activated solid state light emitter comprising a dominant wavelength in a range of from 546 nm to 614 nm.

9. The lighting device according to claim 1, being devoid of any electrically activated solid state light emitter comprising a dominant wavelength in a range of greater than 625 nm.

10. The lighting device according to claim 1, wherein aggregate emissions of the lighting device comprise a gamut area index (GAI) value in a range of from 80 to 100.

11. The lighting device according to claim 1, wherein:
    the at least one first electrically activated solid state light emitter comprises multiple first electrically activated solid state light emitters;
    the at least one second electrically activated solid state light emitter comprises multiple second electrically activated solid state light emitters; and
    the at least one third electrically activated solid state light emitter comprises multiple third electrically activated solid state light emitters.

12. The lighting device according to claim 11, comprising a plurality of clusters of electrically activated solid state light emitters, wherein each cluster of the plurality of clusters includes a first electrically activated solid state light emitter of the multiple first electrically activated solid state light emitters, a second electrically activated solid state light emitter of the multiple second electrically activated solid state light emitters, and a third electrically activated solid state light emitter of the multiple third electrically activated solid state light emitters.

13. The lighting device according to claim 1, comprising at least one of the following features (a) to (e):
   (a) a single leadframe arranged to conduct electrical power to the plurality of electrically activated solid state light emitters;
   (b) a single reflector arranged to reflect at least a portion of light emanating from the plurality of electrically activated solid state light emitters;
   (c) a single submount or mounting element supporting the plurality of electrically activated solid state light emitters;
   (d) a single lens arranged to transmit at least a portion of light emanating from the plurality of electrically activated solid state light emitters; or
   (e) a single diffuser arranged to diffuse at least a portion of light emanating from the plurality of electrically activated solid state light emitters.

14. The lighting device according to claim 1, wherein aggregate emissions of the lighting device comprise a color rendering index (CRI Ra) value in a range not exceeding 50.

15. The lighting device according to claim 1, wherein aggregate emissions of the lighting device comprise a correlated color temperature (CCT) value in a range of from 2700K to 5000K.

16. A light bulb or light fixture comprising the lighting device of claim 1.

17. A lighting device comprising a plurality of electrically activated solid state light emitters including:
   at least one first electrically activated solid state light emitter comprising a first dominant wavelength;
   at least one second electrically activated solid state light emitter comprising a second dominant wavelength; and
   at least one third electrically activated solid state light emitter comprising a third dominant wavelength;
   wherein at least one of the at least one first, the at least one second, or the at least one third electrically activated solid state light emitter comprises a narrow spectral output with a full width-half maximum emission value of no greater than 30 nm;
   wherein aggregate emissions of the lighting device comprise a gamut area index (GAI) value in a range of from 80 to 100; and
   wherein aggregate emissions of the lighting device comprise a correlated color temperature, and comprise a scotopic/photopic ratio in at least one of the following ranges:
   (a) a value of at least 0.000042 times the correlated color temperature, plus 0.53;
   (b) a value of at least 0.000045 times the correlated color temperature, plus 0.57;
   (c) a value of at least 0.000048 times the correlated color temperature, plus 0.62; or
   (d) a value of at least 0.000069 times the correlated color temperature, plus 0.14.

18. The lighting device according to claim 17, wherein the second dominant wavelength exceeds the first dominant wavelength by at least 20 nm, and wherein the third dominant wavelength exceeds the second dominant wavelength by at least 60 nm.

19. The lighting device according to claim 17, further comprising at least one of the following features (i) to (iii):
   (i) the at least one first electrically activated solid state light emitter comprises a dominant wavelength in a range of from 485 nm to 505 nm;
   (ii) the at least one second electrically activated solid state light emitter comprises a dominant wavelength in a range of from 526 nm to 545 nm; or
   (iii) the at least one third electrically activated solid state light emitter comprises a dominant wavelength in a range of from 615 nm to 625 nm.

20. The lighting device according to claim 19, further comprising each of features (i) to (iii).

21. The lighting device according to claim 20, wherein the at least one second electrically activated solid state light emitter comprises a narrow spectral output with a full width-half maximum emission value of no greater than 30 nm.

22. The lighting device according to claim 17, being devoid of any lumiphoric material.

23. The lighting device according to claim 17, further comprising at least one of the following features (a) to (c):
   (a) the lighting device is devoid of any electrically activated solid state light emitter comprising a dominant wavelength in a range of below 485 nm;
   (b) the lighting device is devoid of any electrically activated solid state light emitter comprising a dominant wavelength in a range of from 546 nm to 614 nm; or
   (c) the lighting device is devoid of any electrically activated solid state light emitter comprising a dominant wavelength in a range of greater than 625 nm.

24. The lighting device according to claim 17, wherein:
   the at least one first electrically activated solid state light emitter comprises multiple first electrically activated solid state light emitters;
   the at least one second electrically activated solid state light emitter comprises multiple second electrically activated solid state light emitters; and
   the at least one third electrically activated solid state light emitter comprises multiple third electrically activated solid state light emitters.

25. The lighting device according to claim 24, comprising a plurality of clusters of electrically activated solid state light emitters, wherein each cluster of the plurality of clusters includes a first electrically activated solid state light emitter of the multiple first electrically activated solid state light emitters, a second electrically activated solid state light emitter of the multiple second electrically activated solid state light emitters, and a third electrically activated solid state light emitter of the multiple third electrically activated solid state light emitters.

26. The lighting device according to claim 17, comprising at least one of the following features (a) to (e):
   (a) single leadframe arranged to conduct electrical power to the plurality of electrically activated solid state light emitters;
   (b) a single reflector arranged to reflect at least a portion of light emanating from the plurality of electrically activated solid state light emitters;
   (c) a single submount or mounting element supporting the plurality of electrically activated solid state light emitters;
   (d) a single lens arranged to transmit at least a portion of light emanating from the plurality of electrically activated solid state light emitters; or (e) a single diffuser arranged to diffuse at least a portion of light emanating from the plurality of electrically activated solid state light emitters.

27. The lighting device according to claim 17, wherein aggregate emissions of the lighting device comprise a color rendering index (CRI Ra) value in a range not exceeding 50.

28. The lighting device according to claim 17, wherein aggregate emissions of the lighting device comprise a correlated color temperature (CCT) value in a range of from 2700K to 5000K.

29. A light bulb or light fixture comprising the lighting device of claim 17.

30. The lighting device of claim 1, wherein the lighting device comprises at least two of the features (i) to (vi).

31. The lighting device of claim 1, wherein the lighting device comprises at least three of the features (i) to (vi).

* * * * *